US011088686B2

(12) United States Patent
Suzuki et al.

(10) Patent No.: US 11,088,686 B2
(45) Date of Patent: Aug. 10, 2021

(54) SEMICONDUCTOR MODULE

(71) Applicant: SHINDENGEN ELECTRIC MANUFACTURING CO., LTD., Tokyo (JP)

(72) Inventors: Kenichi Suzuki, Saitama (JP); Wataru Miyazawa, Saitama (JP)

(73) Assignee: SHINDENGEN ELECTRIC MANUFACTURING CO., LTD., Tokyo (JP)

(*) Notice: Subject to any disclaimer, the term of this patent is extended or adjusted under 35 U.S.C. 154(b) by 0 days.

(21) Appl. No.: 16/772,808

(22) PCT Filed: Dec. 19, 2017

(86) PCT No.: PCT/JP2017/045609
§ 371 (c)(1),
(2) Date: Jun. 15, 2020

(87) PCT Pub. No.: WO2019/123551
PCT Pub. Date: Jun. 27, 2019

(65) Prior Publication Data
US 2021/0167770 A1 Jun. 3, 2021

(51) Int. Cl.
*H03K 17/16* (2006.01)
*H01L 25/16* (2006.01)
(Continued)

(52) U.S. Cl.
CPC ......... *H03K 17/162* (2013.01); *G01R 15/181* (2013.01); *H01L 25/16* (2013.01); *H01F 38/28* (2013.01); *H01L 29/2003* (2013.01)

(58) Field of Classification Search
CPC .... H03K 17/162; G01R 15/181; H01L 25/26; H01F 38/28
See application file for complete search history.

(56) References Cited

U.S. PATENT DOCUMENTS

2012/0268091 A1 10/2012 Takemae
2013/0147525 A1 6/2013 Takagiwa
(Continued)

FOREIGN PATENT DOCUMENTS

JP 2012227680 A 11/2012
JP 2013110807 A 6/2013
(Continued)

OTHER PUBLICATIONS

International Search Report in PCT/JP2017/045609, dated Mar. 27, 2018. 4pp.

*Primary Examiner* — Dinh T Le
(74) *Attorney, Agent, or Firm* — Hauptman Ham, LLP

(57) ABSTRACT

A semiconductor module includes: a semiconductor substrate; a switching element having a first electrode, a second electrode, and a gate electrode, and the switching element configured to perform turning on/off between the first electrode and the second electrode in response to applying of a predetermined gate voltage to the gate electrode; a control circuit part configured to control the gate voltage; and a current detection element configured to detect a current which flows between the first electrode and the second electrode of the switching element, wherein the switching element, the control circuit part, and the current detection element are mounted on the semiconductor substrate, and the current detection element is formed of a Rogowski coil.

8 Claims, 18 Drawing Sheets

(51) Int. Cl.
  *G01R 15/18* (2006.01)
  *H01F 38/28* (2006.01)
  *H01L 29/20* (2006.01)

(56) References Cited

U.S. PATENT DOCUMENTS

| | | | |
|---|---|---|---|
| 2014/0284662 A1 | 9/2014 | Ikeda | |
| 2015/0171750 A1* | 6/2015 | Zeng | H01L 27/0605 |
| | | | 323/311 |
| 2019/0146026 A1* | 5/2019 | Kimura | H03M 1/12 |
| | | | 324/750.03 |

FOREIGN PATENT DOCUMENTS

| | | |
|---|---|---|
| JP | 2014187726 A | 10/2014 |
| JP | 2017158407 A | 9/2017 |
| WO | 2012153459 A1 | 11/2012 |

* cited by examiner

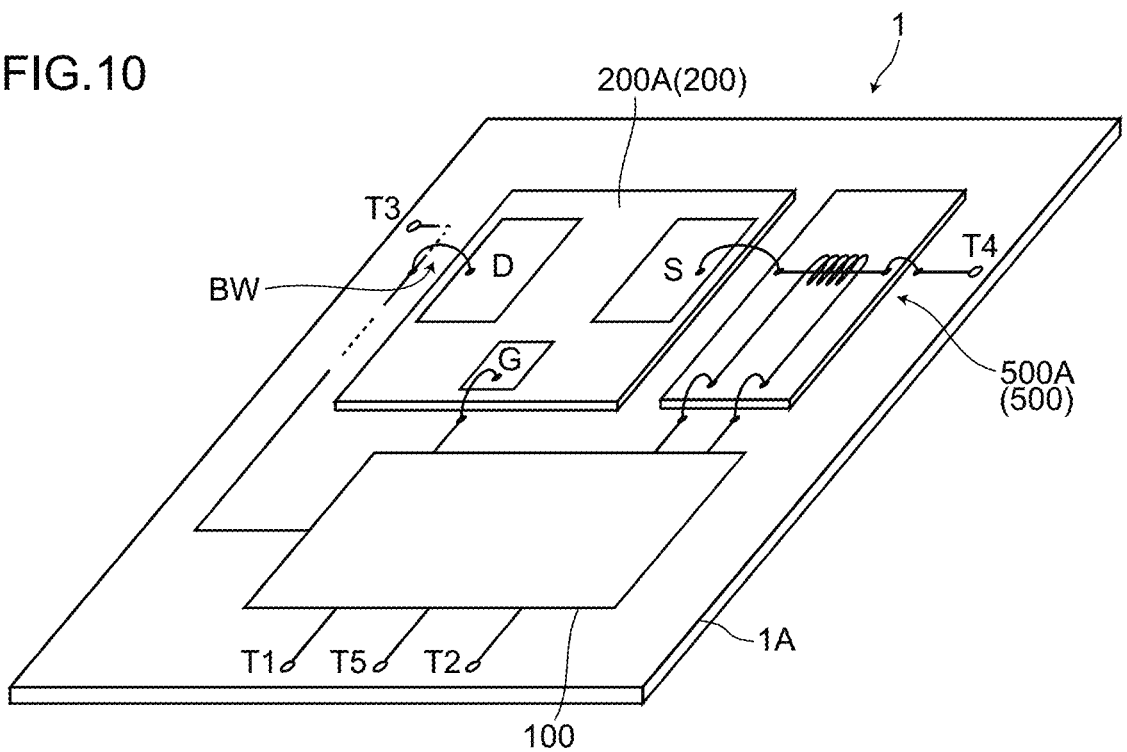
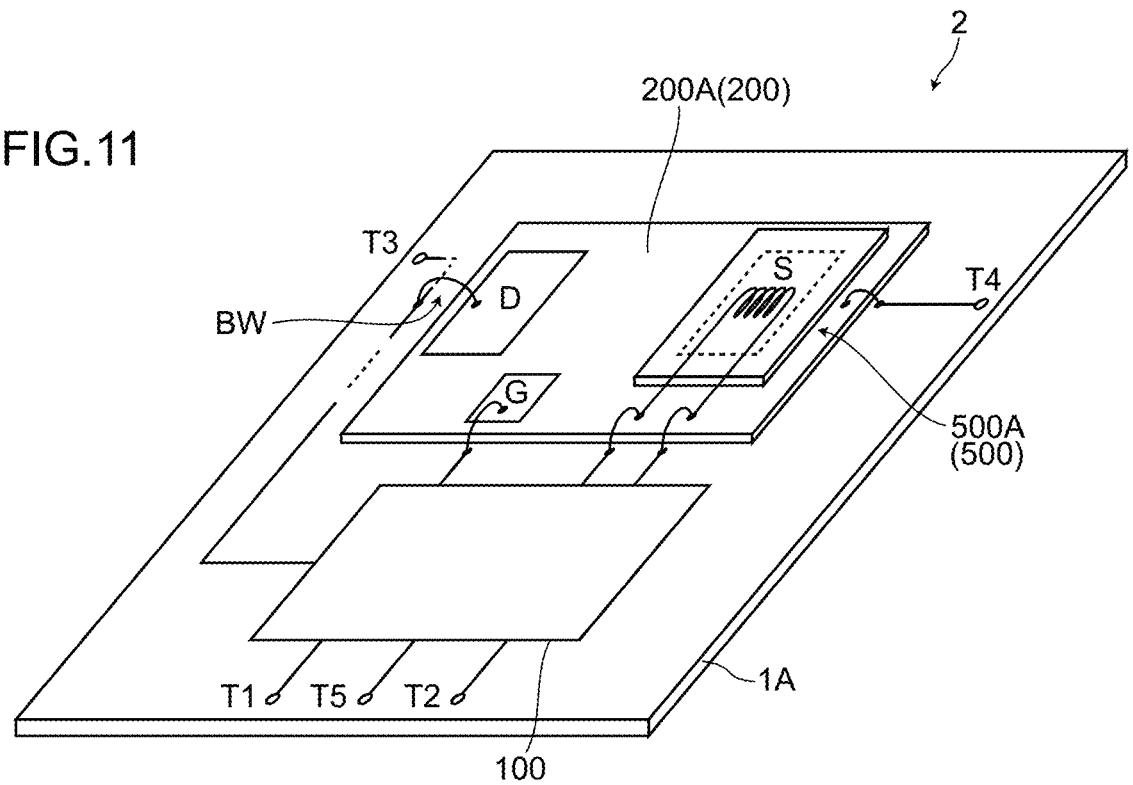

SEMICONDUCTOR MODULE

RELATED APPLICATIONS

The present application is a National Phase of International Application Number PCT/JP2017/045609, filed Dec. 19, 2017.

TECHNICAL FIELD

The present invention relates to a semiconductor module.

BACKGROUND ART

Conventionally, there has been known a semiconductor device (semiconductor module) in which a switching element for controlling turning on/off of the switching element and a drive circuit for performing a drive control of the switching element are packaged (for example, see patent document 1).

In the conventional semiconductor module, as shown in FIG. 22, a switching element control circuit 900 of the semiconductor module includes a gate voltage control part 920 which controls a gate voltage for controlling turning on/off of a switching element 800.

This switching element control circuit 900 can control turning on/off of the switching element 800 by controlling a gate voltage.

PRIOR ART DOCUMENT

Patent Document

Patent document 1: WO 2012/153459

SUMMARY OF INVENTION

Problems to be Solved by the Invention

Although switching elements are expected to be manufactured uniformly, there may be a case where irregularities occur among individual switching elements. There may be a case where fine irregularities occur among individual threshold voltages of gate voltages for performing switching.

However, conventional semiconductor modules on each of which a switching element is mounted have not taken into account an idea of performing optimum abilities individually corresponding to irregularities of characteristics of the switching elements.

Recently, there has been a demand for a switching element control circuit capable of reducing a switching loss by increasing a switching speed. As one of methods for satisfying such a demand, a method may be considered where a switching speed is increased so as to reduce a switching loss by applying a gate voltage which slightly exceeds a threshold voltage to a gate electrode which performs an ON/OFF control thus shortening a turn-on period and a turn-off period.

However, there may be a case where a threshold voltage of a switching element fluctuates due to irregularities in the manufacture of a switching element and hence, it is difficult to apply a gate voltage which slightly exceeds the threshold voltage to a gate electrode of the switching element. Accordingly, it is difficult to increase a switching speed thus giving rise to a drawback that it is difficult to reduce a switching loss.

Further, in a case where a threshold voltage of a switching element fluctuates in a direction that the threshold voltage becomes higher than a designed threshold voltage due to irregularities in the manufacture of the switching element, there may be a case where a switching element is not brought into an ON state even when a gate voltage which slightly exceeds the designed threshold voltage is applied to a gate electrode thus also giving rise to a drawback that turning on/off of the switching element may not be controlled. Particularly, this drawback becomes more conspicuous when the difference between an absolute maximum rated voltage and a threshold voltage is small as in the case of a semiconductor device made of gallium nitride (GaN) or the like.

It is also theoretically possible that a threshold voltage of a switching element is measured before the switching element is incorporated into a switching element control circuit, and a gate voltage is decided based on the measured threshold voltage. However, in general, switching elements are manufactured on a mass production basis and hence, there also arises a drawback that an operation of measuring threshold voltages of the respective manufactured switching elements becomes extremely cumbersome whereby it is difficult to enhance productivity.

The present invention has been made to overcome such drawbacks, and it is an object of the present invention to provide a semiconductor module provided with a switching element control circuit which can realize at least one of the reduction of a switching loss of a switching element, a proper control of turning on/off of the switching element, the enhancement of productivity of the semiconductor module, and downsizing of the semiconductor module.

Solution to Problem

[1] According to the present invention, there is provided a semiconductor module which includes: a semiconductor substrate; a switching element which has a first electrode, a second electrode, and a gate electrode, the switching element performing turning on/off between the first electrode and the second electrode in response to applying of a predetermined gate voltage to the gate electrode; a control circuit part which controls the gate voltage; and a current detection element which detects a current which flows between the first electrode and the second electrode of the switching element, wherein the switching element, the control circuit part, and the current detection element are mounted on the semiconductor substrate, and the current detection element is formed of a Rogowski coil.

[2] In the semiconductor module according to the present invention, the control circuit part may be configured to be operated by switching a mode between a measurement mode where the gate voltage for turning on/off the switching element is measured and a control mode where the turning on/off of the switching element is controlled, the control circuit part may include: a threshold voltage measurement power source which supplies the current to the first electrode of the switching element in the measurement mode; a gate voltage control part which controls the gate voltage such that the gate voltage changes in a stepwise manner in the measurement mode, and controls the gate voltage so as to control turning on/off of the switching element in the control mode; an ON/OFF state determination part which determines an ON/OFF state of the switching element based on a detection result of the current which flows between the first electrode and the second electrode by the current detection element in the measurement mode; and a memory part which stores gate voltage relating information which relates to the threshold voltage in the measurement mode, and the gate voltage control part controls the gate voltage based on the gate voltage relating information stored in the memory part when the switching element is brought into an ON state in the control mode.

[3] In the semiconductor module according to the present invention, a gallium-nitride-based semiconductor substrate may be used as the semiconductor substrate.

[4] In the semiconductor module according to the present invention, the switching element may be formed by combining a normally-on gallium nitride semiconductor switch which is formed using the gallium-nitride-based semiconductor substrate as a material and a normally-off semiconductor switch which is connected to the normally-on gallium nitride semiconductor switch in cascode connection and may turn on/off the normally-on gallium nitride semiconductor switch.

[5] In the semiconductor module according to the present invention, the semiconductor substrate may have a flat plate shape, and the switching element and the Rogowski coil may be disposed on the semiconductor substrate having the flat plate shape such that the switching element and the Rogowski coil do not overlap with each other as viewed in a direction perpendicular to the semiconductor substrate having the flat plate shape.

[6] In the semiconductor module according to the present invention, the semiconductor substrate may have a flat plate shape, and the switching element and the Rogowski coil may be disposed on the semiconductor substrate having the flat plate shape such that the switching element and the Rogowski coil overlap with each other as viewed in a direction perpendicular to the semiconductor substrate having the flat plate shape.

[7] In the semiconductor module according to the present invention, the semiconductor substrate may include: a wire through which a current flows between the first electrode and the second electrode of the switching element; and a circulating wire around the wire, and the circulating wire is formed of the Rogowski coil.

Advantageous Effects of Invention

The semiconductor module according to the present invention includes the switching element, the control circuit part controlling a gate voltage of the switching element, and the current detection element detecting a current which flows through the switching element. Accordingly, even when threshold values of gate voltages individually differ from each other due to irregularities in the manufacture of switching elements, it is possible to grasp proper threshold values individually and hence, it is possible to perform proper ON/OFF controls individually.

Further, the current detection element is formed of the Rogowski coil and hence, the current detection element can measure a current in a non-contact manner with the switching element which is an object to be detected. Accordingly, even when fine irregularities exist in threshold values of gate voltages, currents can be measured with high accuracy individually without giving an adverse effect to the switching elements.

In the semiconductor module according to the present invention, the switching element, the control circuit part, and the current detection element are mounted on the semiconductor substrate. Accordingly, the entirety of these elements can be treated as a semiconductor module and hence, convenience of the semiconductor module is enhanced. Further, at least some of the elements such as the switching element, the control circuit and the like can be manufactured on the semiconductor substrate using a semiconductor process and hence, a semiconductor module can be easily manufactured and downsizing of the semiconductor module can be realized. Even in the case where a Rogowski coil or the like is used as a discrete part, the Rogowski coil or the like can be easily mounted on the semiconductor substrate.

Even when the semiconductor module is used as a switch which withstands a high current or a high voltage, with the use of the Rogowski coil and mounting of the switching element and the like on the semiconductor substrate, large downsizing of the entirety of the module can be realized.

BRIEF DESCRIPTION OF DRAWINGS

FIG. 4A is a schematic view of a graph showing a change with time of a gate-source voltage when a gate voltage is applied to a gate electrode in a switching element control circuit according to a comparison example, FIG. 4B is a schematic view of a graph showing a change with time of a gate-source voltage when a gate voltage which slightly exceeds a threshold voltage is applied to a gate electrode in the switching element control circuit 100 according to the embodiment. FIGS. 4C, 4D and 4E are explanatory views of applied gate voltages.

FIG. 10 is an explanatory view of the semiconductor module 1 according to the embodiment.

FIG. 11 is an explanatory view of a semiconductor module 2 according to a modification.

DESCRIPTION OF EMBODIMENTS

Figure 1:
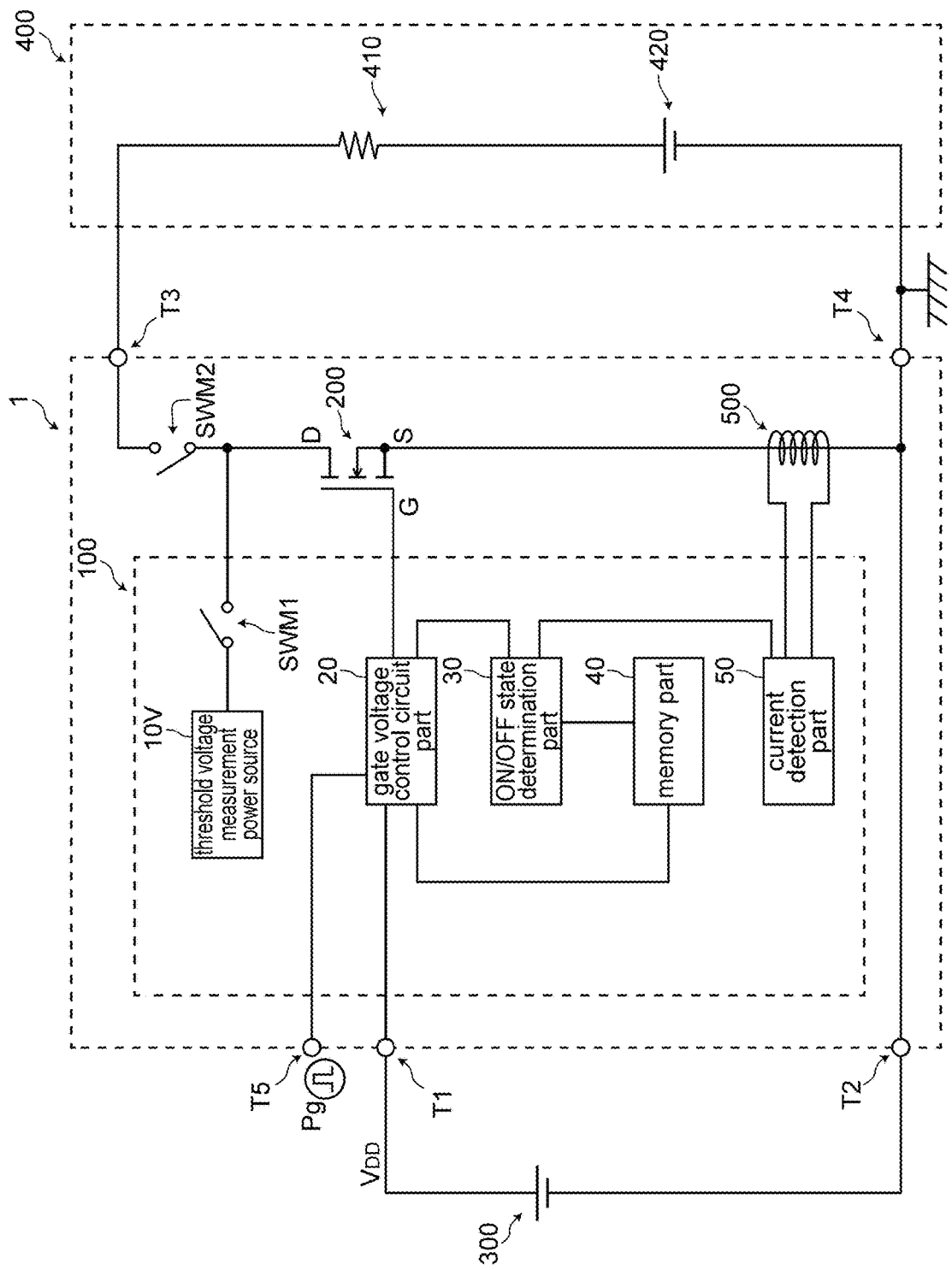
FIG. 1 is a circuit diagram showing a semiconductor module 1 according to an embodiment.

Hereinafter, a semiconductor module according to the present invention is described with respect to an embodiment shown in the drawings. The semiconductor module according to the present invention is formed as one package by combining at least one semiconductor element and other electric devices. The semiconductor module according to the present invention may include a power semiconductor which treats a relatively high current or a relatively high voltage. The respective drawings are schematic drawings, and these drawings do not always strictly reflect the actual circuit configuration and graphs.

Embodiment

1. Configuration of Semiconductor Module 1 According to Embodiment

FIG. 1 is a circuit diagram of a semiconductor module 1 according to the embodiment. The semiconductor module 1 includes a semiconductor substrate 1A (not shown in the drawing), a switching element 200, a control circuit part (switching element control circuit part) 100, and a current detection element 500. The control circuit part (switching element control circuit part) 100 controls a gate voltage, and performs an ON/OFF control of the switching element 200. The current detection element 500 detects a current which flows between a first electrode (drain electrode D) of the switching element 200 and a second electrode (source electrode S) of the switching element 200. The switching element 500, the control circuit 100, and the current detection element 500 are mounted on the semiconductor substrate 1A. The current detection element 500 is formed of a Rogowski coil.

The semiconductor module 1 according to the embodiment can be covered by a package formed of a resin, ceramic or the like which possesses high heat resistance and high insulation property, for example. The semiconductor module 1 according to the embodiment includes: a (+) side input terminal T1 to which a power source voltage $V_{DD}$ of a direct current is inputted; a (−) side input terminal T2 on a ground side, a(+) side output terminal T3, a (−) side output terminal 14 on the ground side, and a control terminal T5 to which a mode instruction signal (a drive signal for instructing a mode, for example, a gate pulse for instructing a mode) Pg is inputted.

A gate drive power source 300 for applying a power source voltage $V_{DD}$ is connected between the (+) side input terminal T1 and the (−) side input terminal T2. The gate drive power source 300 applies a predetermined voltage to a gate electrode G of the switching element 200 via the gate voltage control part 20. A load circuit 400 is connected to the (+) side output terminal T3 and the (−) side output terminal T4. The load circuit 400 includes, for example, a load resistance 410 and a load power source (power source for driving a load) 420 of a direct current. The load resistance 410 and the load power source 420 are connected in series between the (+) side output terminal T3 and the (−) side output terminal T4. The (−) side output terminal T4 is grounded.

The switching element 200 is a MOSFET (Metal-Oxide-Semiconductor Field-Effect Transistor) having the drain electrode D (first electrode), the source electrode S (second electrode), and the gate electrode G. The switching element 200 is brought into an ON state when a gate voltage which exceeds a threshold voltage (actual threshold voltage Vth) is applied to the gate electrode G, and is brought into an OFF state when the gate voltage becomes lower than the threshold voltage. The gate voltage is controlled by the gate voltage control part 20 described later using a gate voltage generated from a power source voltage $V_{DD}$. A suitable switching element such as a semiconductor switch, a photocoupler or the like can be used as the switching element 200. In this embodiment, the switching element 200 is a MOSFET. The switching element 200 is formed using a material which contains GaN (gallium nitride).

The drain electrode D (first electrode) of the switching element 200 is connected to the load circuit 400 via the (+) side output terminal T3, and is connected to a threshold voltage measurement power source 10V described later via a switching element (switch) SWM1 described later. The gate electrode G of the switching element 200 is connected to the gate voltage control part 20. The source electrode S (second electrode) of the switching element 200 is connected to the current detection part 50, and is connected to the (−) side output terminal T4 via a resistor.

The switching element control circuit 100 according to the embodiment includes the threshold voltage measurement power source 10V, the switching element SWM1, the gate voltage control part 20, an ON/OFF state determination part 30, a memory part 40, and the current detection part 50.

The semiconductor module 1 (switching element control circuit 100) includes: a measurement mode where a threshold value of a gate voltage of the switching element 200 is measured; and a control mode where the load 400 is driven by controlling switching of the switching element 200 using the threshold value obtained in the measurement mode. The semiconductor module 1 is configured to be operated by switching a mode between these two modes.

The threshold voltage measurement power source 10V is a power source used for measuring a threshold value of the switching element 200 in the measurement mode.

The gate voltage control part 20 is a circuit for controlling a gate voltage applied to the gate electrode G of the switching element 200.

In the measurement mode, when the ON/OFF state determination part 30 described later determines that the switching element 200 is in an OFF state, the gate voltage control part 20 controls a gate voltage such that the gate voltage is increased by one stage (see FIG. 5, Id in FIG. 5 indicating a current (switching current) which flows between the first electrode D and the second electrode S, the switching current being sharply increased when the switching element 200 is turned on, and being sharply decreased when the switching element 200 is turned off, the same phenomenon occurring also in FIG. 6). Further, when the ON/OFF state determination part 30 described later determined that the switching element 200 is in an ON state, the gate voltage control part 20 transmits a gate voltage Vgs which is applied to the gate electrode to the memory part 40 as a threshold voltage.

In the measurement mode, the current detection part 50 detects a switching current Id of the switching element 200, and transmits a detection result to the ON/OFF state determination part 30. In this embodiment, a Rogowski coil is used as the current detection element 500.

In the measurement mode, the ON/OFF state determination part 30 determines an ON/OFF state of the switching element 200 based on the detection result received from the current detection part 50.

In the measurement mode, the memory part 40 may store a gate voltage applied to the gate electrode G when the ON/OFF state determination part 30 determines that the switching element 200 is brought into an ON state as gate voltage relating information which relates to a threshold voltage of the switching element 200. As the gate voltage relating information, for example, a lowest gate voltage (value) per se when the switching element 200 is brought into an ON state, a voltage (value) obtained by adding a fixed amount of voltage to the lowest gate voltage when the switching element 200 is brought into an ON state, a voltage (value) which is a predetermined time as large as the lowest gate voltage (for example, 105%, 110%, 115% . . . ) and the like are named. Further, a voltage (value) table showing various values is additionally stored in the memory part 40, and the gate voltage relating information may be voltage location information in such a table which indicates a specific voltage (value) in the table.

The gate voltage control part 20 is connected to the gate drive power source 300 via the (+) side input terminal T1, and is also connected to the control terminal T5. Further, the gate voltage control part 20 is connected to the memory part 40. The ON/OFF state determination part 30 is connected to the gate voltage control part 20, the memory part 40, and the current detection part 50 respectively.

The gate drive power source 300 ($V_{DD}$) may also function as a power source for the switching element control circuit 100.

The load power source (load drive power source) 420 may also function as the gate drive power source 300 ($V_{DD}$). In this case, it is unnecessary to provide the load power source 420 in addition to the gate drive power source 300 ($V_{DD}$).

When a voltage of the load power source 420 is higher than a voltage of the gate drive power source 300 ($V_{DD}$), the voltage of the gate drive power source 300 ($V_{DD}$) may be generated from the voltage of the load power source 420. However, both voltages may be supplied from different power sources. When a voltage of the load power source 420 is higher than a voltage of the gate drive power source 300 ($V_{DD}$), a high voltage is applied to the switching element 200 or a high current flows into the switching element 200. Even in such a case, an ON/OFF control of the switching element 200 can be performed with a gate voltage using a voltage of the low voltage power source (gate drive power source 300).

To accurately measure a threshold value of the switching element 200, it is preferable to prepare the threshold voltage measurement power source 10V as a power source different from the gate drive power source 300. For example, a case is considered where a high current is used as the threshold voltage measurement power source 10V such that a threshold value can be accurately measured even when a high current flows into the switching element 200 in the case where the switching element 200 is in an ON state. When such necessity does not exist, the gate drive power source 300 may be used as a threshold voltage measurement power source.

A switching element (switch) SWM2 can be omitted. For example, the switching element SWM2 can be omitted in the case where a threshold voltage of the switching element 200 is measured without connecting the load circuit 400 to the semiconductor module 1. Specifically, in a state where the switching element SWM2 is not provided and the load 400 is not connected to the semiconductor module 1, the switching element SWM1 is turned on, the switching element 200 is turned on or off by applying a gate voltage from the gate voltage control circuit part 20 to the gate G of the switching element 200, and a threshold value (minimum on gate voltage) of the switching element 200 is measured using the current detection element 500. Next, the load circuit 400 is connected to the semiconductor module 1, and an ON/OFF control of the switching element 200 is performed based on a result of the threshold value measurement.

2. Manner of Operation of Semiconductor Module According to Embodiment

Figure 2:
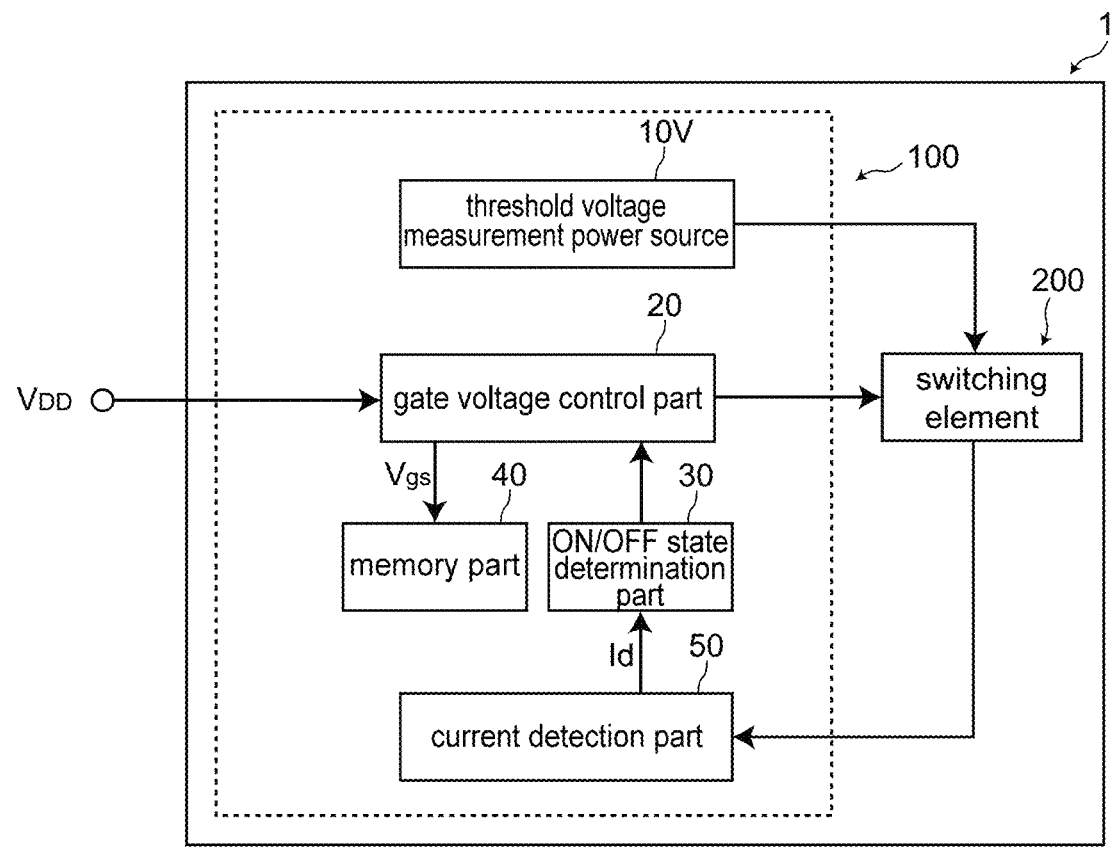
FIG. 2 is a block diagram describing a measurement mode of a switching element control circuit 100 according to the embodiment.

The semiconductor module 1 of the embodiment can have (include) a measurement mode and a control mode.
(1) Measurement Mode and Control Mode The semiconductor module 1 (switching element control circuit 100) of the embodiment has the measurement mode where a threshold voltage of the switching element 200 is measured by separating the switching element 200 from the load circuit 400, a control mode where an ON/OFF control of the switching element is performed using the threshold voltage measured in the measurement mode by connecting the load circuit 400 to the semiconductor module 1.
(1)-1 Measurement Mode FIG. 2 is a block diagram for describing a measurement mode of the switching element control circuit 100 according to the embodiment.

The measurement mode is a mode where a threshold voltage of the switching element 200 connected to the switching element control circuit 100 is measured.

In the measurement mode, a threshold voltage of the switching element 200 is measured in a state where there is no supply of a power source from the load power source (load drive power source) 420. In FIG. 1, the switching element SWM1, which is provided between the switching element 200 which is an object to be measured and the threshold voltage measurement power source 10V, is turned on, and the switching element SWM2, provided between the switching element 200 and the load power source 420, is turned off. Then, a current for threshold voltage measurement is supplied from the threshold voltage measurement power source 10V to the drain electrode D (the first electrode) of the switching element 200.

In the measurement mode, the gate voltage control part 20 changes a gate voltage in a stepwise manner. For example, the gate voltage control part 20 controls the gate voltage such that the gate voltage is increased in a stepwise manner with a lapse of time (see FIG. 5). Specifically, the gate voltage is controlled as described below.

First, the gate voltage control part 20 controls the gate voltage such that a voltage lower than an estimated threshold voltage is applied to the gate electrode G. At this stage of operation, a current (switching current), which flows between the first electrode D and the second electrode S (a value of the switching current being 0), is not detected by the current detection part 50 which receives a signal of the current detection element 500 which uses a Rogowski coil. Accordingly, the ON/OFF state determination part 30 determines that the switching element 200 is in an OFF state. When the ON/OFF state determination part 30 determines that the switching element 200 is in an OFF state, the gate voltage control part 20 controls a gate voltage such that the gate voltage is increased by one stage (see FIG. 5). The gate voltage is gradually increased by repeating such an operation, and when a switching current is detected by the current detection part 50 (the value of the switching current taking a value other than 0), the ON/OFF state determination part 30 determines that the switching element 200 is in an ON state. When the ON/OFF state determination part 30 determines that the switching element 200 is in an ON state, the gate voltage control part transmits a gate voltage Vgs applied to the gate electrode to the memory part 40 as a threshold voltage. Then, the memory part 40, using the gate voltage Vgs applied to the gate electrode when the switching current is detected as the threshold voltage, stores information relating to the threshold voltage.

Figure 5:
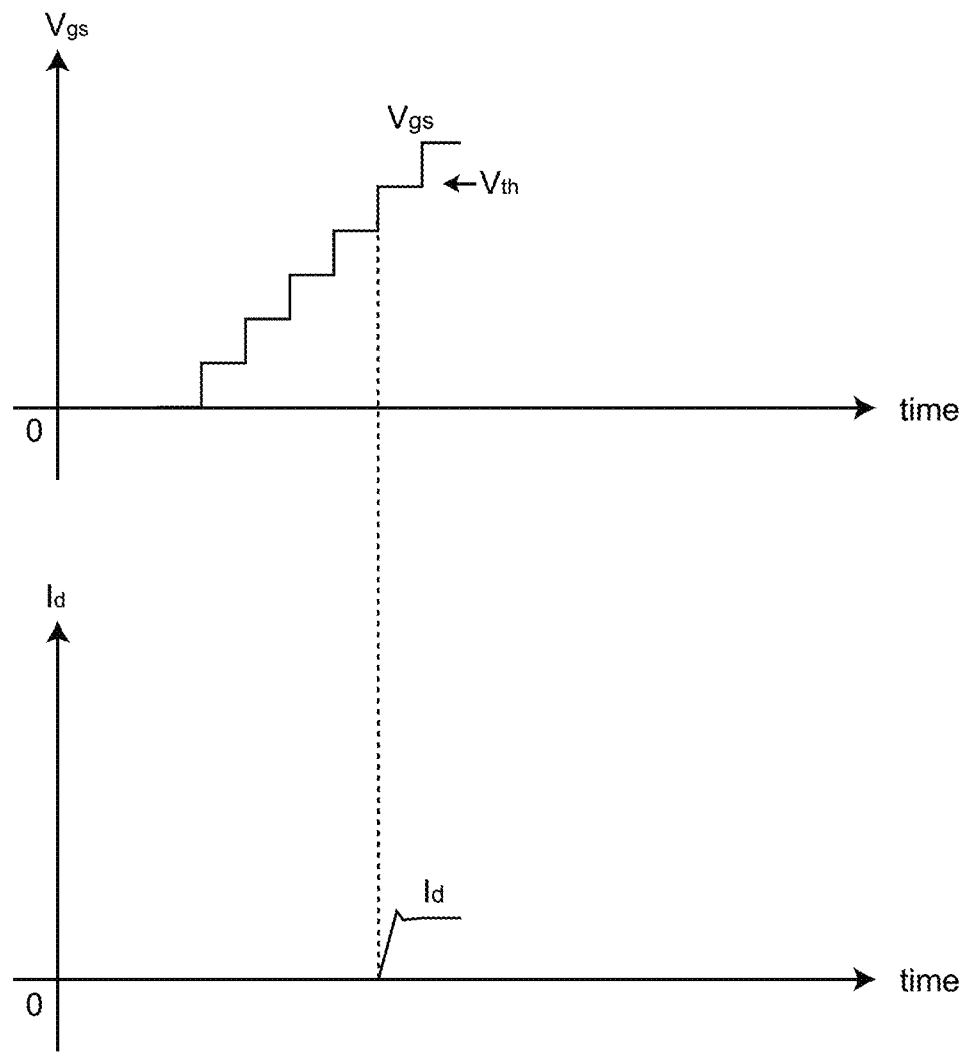
FIG. 5 is a view describing a measurement mode of the embodiment.
Figure 6:
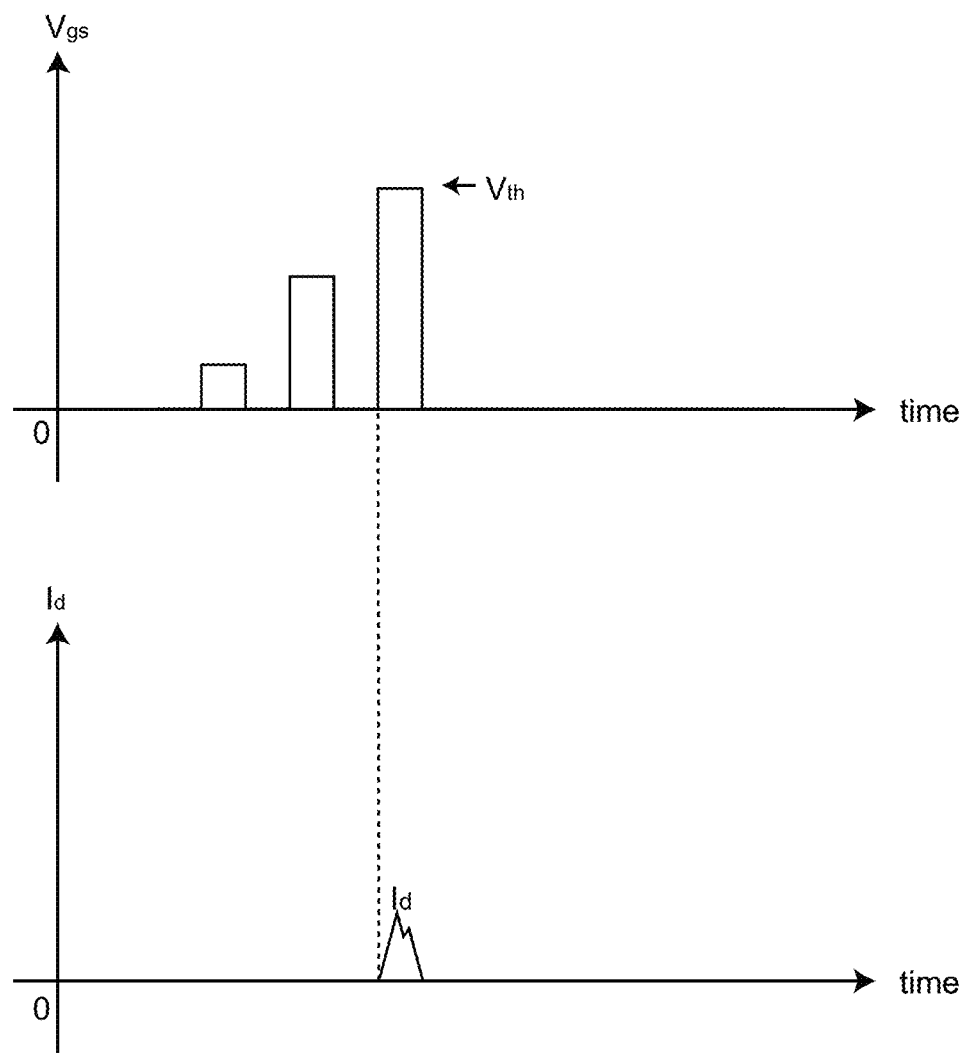
FIG. 6 is a view describing a measurement mode of a modification.

In FIG. 5, a gate voltage is gradually increased. However, the gate voltage may be gradually lowered from a high state. In this case, the switching element 200 is in an ON state (is determined to be an ON state) in a state where the gate voltage is high. When the gate voltage is gradually lowered and is determined that the switching element 200 is turned off, a lowest voltage at which the gate voltage is turned on is set as a threshold value.

A change in gate voltage may be not only a minimum stepwise change (one stage change) but also a large change such as a two stage change which is twice as large as the minimum stage change or a three stage change which is three time as large as the minimum stage change.

Assuming stepwise voltages to G1, G2, . . . G10 from a low voltage side, a minimum voltage at which the switching element 200 is turned on may be obtained by gradually increasing accuracy of the ON/OFF determination after the initial rough ON/OFF determination in such a manner that after the ON determination is made at the applied voltage G1, the OFF determination is made at the applied voltage G2, the OFF determination is made at the applied voltage G4, the ON determination is made at the applied voltage G6, and the ON determination is made at the applied voltage G5.

(1)-2 Control Mode

Figure 3:
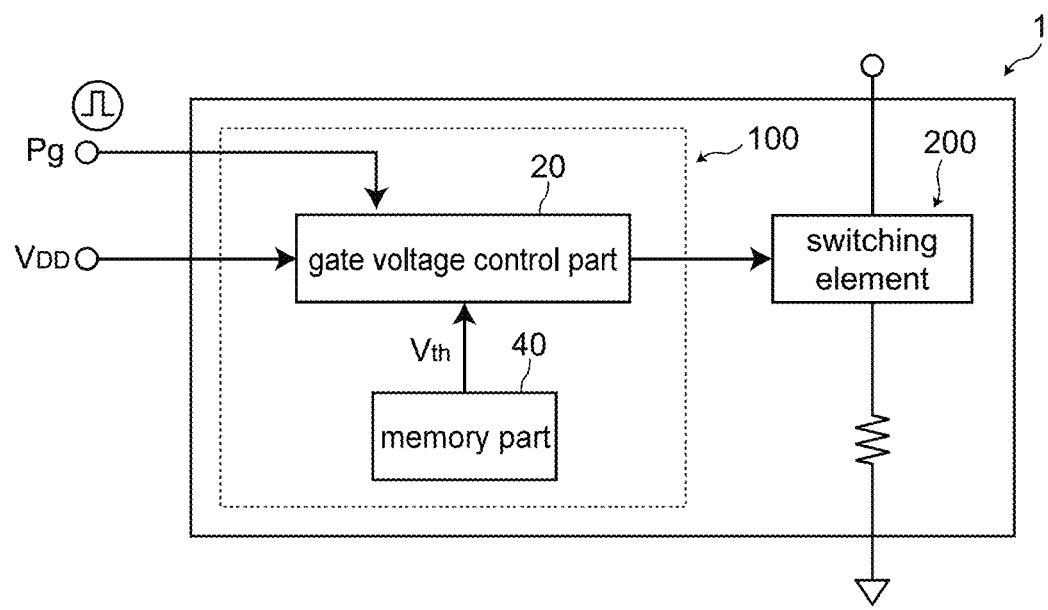
FIG. 3 is a block diagram describing a control mode of the switching element control circuit 100 according to the embodiment.

FIG. 3 is a block diagram for describing a control mode of the switching element control circuit 100 according to the embodiment.

In the control mode, by turning off the switching element SWM1 (see FIG. 1) (by turning on the switching element SWM2), the supply of a current for threshold voltage measurement from the threshold voltage measurement power source 10V to the switching element 200 is stopped. Then, in a state where a load resistor 410 and the load power source (load drive power source) 420 are connected to the switching element 200, turning on/off of the switching element 200 is controlled in response to a mode instruction signal (mode instruction drive signal, for example, a gate pulse) Pg from the control terminal T5. In the control mode, turning on/off of the switching element 200 is performed by controlling a gate voltage applied to the gate electrode G based on gate voltage relating information relating to a threshold value of the gate voltage obtained in the measurement mode. In the control mode, to bring the switching element 200 into an ON state, the gate voltage control part 20 applies a gate voltage which slightly exceeds a threshold voltage to the gate electrode based on gate voltage relating information stored in the memory part 40 (see FIG. 4B). To bring the switching element 200 into an OFF state, the gate voltage applied to the gate electrode is set to a value lower than the threshold voltage Vth. In a case where the threshold value obtained in the measurement mode is stored as it is, although the threshold value may be applied to the gate electrode as it is, a voltage which exceeds the threshold value is applied to the gate electrode to surely turn on the switching element 200. In storing the threshold value in the memory part 40, a voltage which exceeds a measured lowest voltage (threshold value) may be stored, and the voltage may be applied to gate electrode.

In FIG. 3, Pg indicates a mode instruction signal (omitted in FIG. 2).

(2) Control of Gate Voltage

A gate applied voltage applied to the gate electrode G of the switching element 200 in a control mode is described with reference to FIGS. 4A, 4B, 4C, 4D and 4E.

Figure 4A:
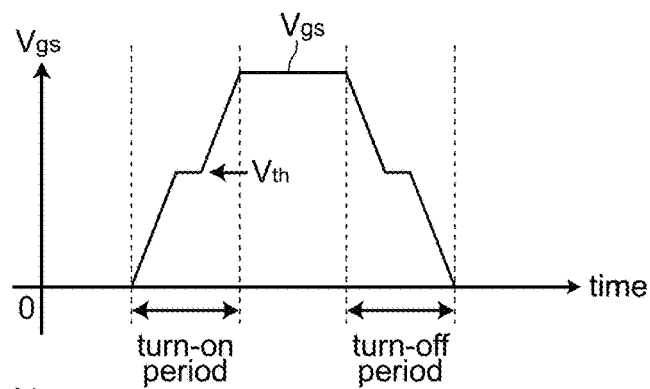
FIGS. 4A to 4E are views describing an advantageous effect when a gate voltage which slightly exceeds a threshold voltage is applied to a gate electrode.

FIG. 4A is an explanatory view of a comparison example. FIG. 4A shows a change with time of a gate-source voltage when a gate voltage which largely exceeds the threshold value is applied to the gate electrode G. The excessively high voltage which largely exceeds the threshold value is applied to the gate electrode G compared to the case shown in FIG. 4B which is a graph of this embodiment and hence, large electric power is consumed compared to the case shown in FIG. 4B. Further, a turn-on period during which the switching element 200 changes from an OFF state to an ON state and a turn-off period during which the switching element 200 changes from an ON state to an OFF state are long compared to a turn-on period and a turn-off period in the case shown in FIG. 4B.

Figure 4B:
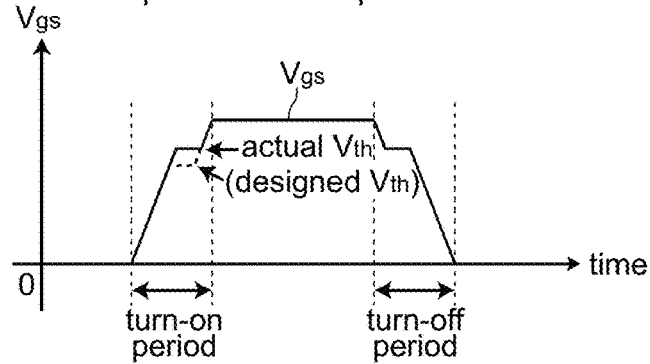

FIG. 4B is a schematic view of a graph showing a change with time of a gate-source voltage when a gate voltage which slightly exceeds the threshold voltage is applied to the gate electrode. Compared to the comparison example shown in FIG. 4A, electric power consumed at the time of turning on the switching element 200 can be reduced in the case shown in FIG. 4B. A turn-on time during which the switching element 200 changes from an OFF state to an ON state and a turn-off time during which the switching element 200 changes from an ON state to an OFF state becomes short compared to the case shown in FIG. 4A and hence, high-speed switching can be realized.

In FIG. 4B, at the time of turning on the switching element 200, a gate voltage is increased linearly. In increasing the gate voltage, at a value close to the threshold value, the gate voltage stays at the value close to the threshold value for a short time even when a time elapses and, thereafter, the gate voltage is increased again until the gate voltage slightly exceeds the threshold value. At the time of turning off the switching element 200, the gate voltage is linearly decreased. In decreasing the gate voltage, at a value close to the threshold value, the gate voltage stays at the value close to the threshold value even when a time elapses and, thereafter, the gate voltage is decreased again until the gate voltage becomes lower than the threshold value.

Figure 4C:
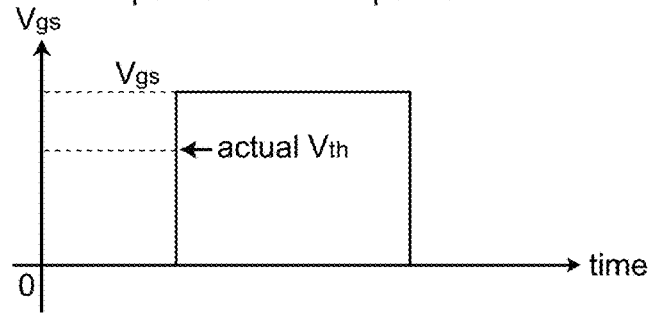
Figure 4D:
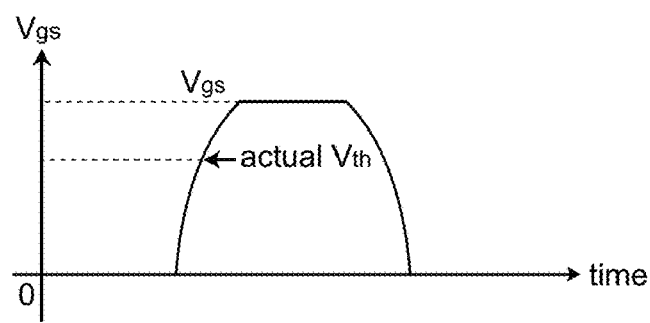
Figure 4E:
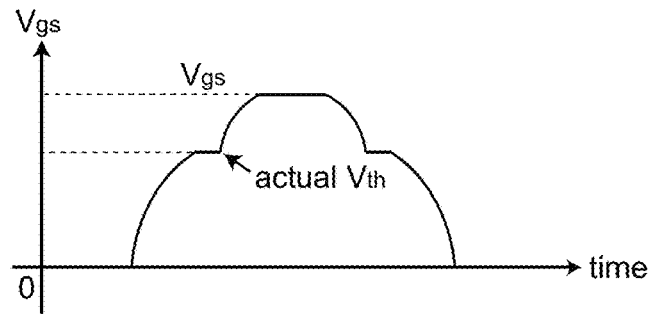

FIGS. 4C to 4E show other embodiments (modes) when a gate voltage is applied to the switching element 200.

In FIG. 4C, at the time of turning on the switching element 200, a gate voltage is instantaneously increased to a voltage which slightly exceeds a threshold value. At the time of turning off the switching element 200, the gate voltage is instantaneously decreased to a voltage lower than the threshold value. The switching element 200 may be turned on or turned off by changing a gate voltage in this manner.

FIG. 4D shows a mode where, by taking time on an axis of abscissas and a gate voltage on an axis of ordinates in the graph, the gate voltage shows a waveform having an upward convex shape at the time of turning on the switching element 200 or at the time of turning off the switching element 200. In the switching element 200, a floating capacitance or the like is liable to be generated between the drain electrode D, the source electrode S, the gate electrode G and the like. By allowing the gate voltage to have such a waveform, the switching element 200 can be manufactured easily, and also the waveform of the gate voltage can be easily controlled. The gate voltage having such a waveform is desirable due to reasons such as a reason that the switching element 200 can be easily manufactured and a control waveform can be easily formed, and a reason that the manufacture of the switching element 200 from which a floating capacitance is almost eliminated is difficult.

FIG. 4E shows a mode where the waveform shown in FIG. 4D is further modified. By taking time on an axis of abscissas and taking a gate voltage on an axis of ordinates in the graph, a gate voltage having an upward convex shape is increased from a voltage lower than a threshold value to a value close to the threshold value at the time of turning on the switching element 200. In increasing the threshold value, the gate voltage stays at a value close to the threshold value for a short time even when a time elapses and, thereafter, the gate voltage is increased again until the gate voltage slightly exceeds the threshold value. At the time of turning off the switching element 200, the gate voltage having the convex shape is decreased from a voltage which exceeds the threshold value to the value close to the threshold value. At a value close to the threshold value, the gate voltage stays for a short time at the value close to the threshold value even when a time elapses and, thereafter, the gate voltage is decreased again until the gate voltage becomes lower than the threshold value. A floating capacitance or the like is liable to be generated in the switching element 200. By allowing the gate voltage to have such a waveform, the switching element 200 can be manufactured easily, and also the waveform of the gate voltage can be easily formed.

(3) Advantageous Effects Acquired by Having Measurement Mode

By allowing the semiconductor module 1 according to the embodiment to have such measurement modes, the semiconductor module 1 can acquire at least one of the following advantageous effects.

There may be a case where the threshold value of the gate voltage deviates from a designed threshold value due to irregularities in manufacture or the like of the switching element 200 mounted on the semiconductor module 1. Even in such a case, the switching element 200 can be properly turned on or turned off.

When a voltage which largely exceeds a threshold value is applied to the gate electrode G, there may be a case where excessively large electric power more than electric power necessary for turning on or off the switching element 200 is consumed. By turning on the switching element 200 by applying a gate voltage which slightly exceeds a threshold value, wasteful power consumption can be reduced.

Compared to the case where a gate voltage which largely exceeds a threshold voltage is applied to the gate electrode of the switching element (see FIG. 4A describing the comparison example), a turn-on period and a turn-off period can be shortened and hence, a switching speed of the switching element can be increased.

(4) Gate Voltage Control Circuit Part 20

A control of a gate voltage is described in detail with reference to the gate voltage control (circuit) part 20.

Figure 7:
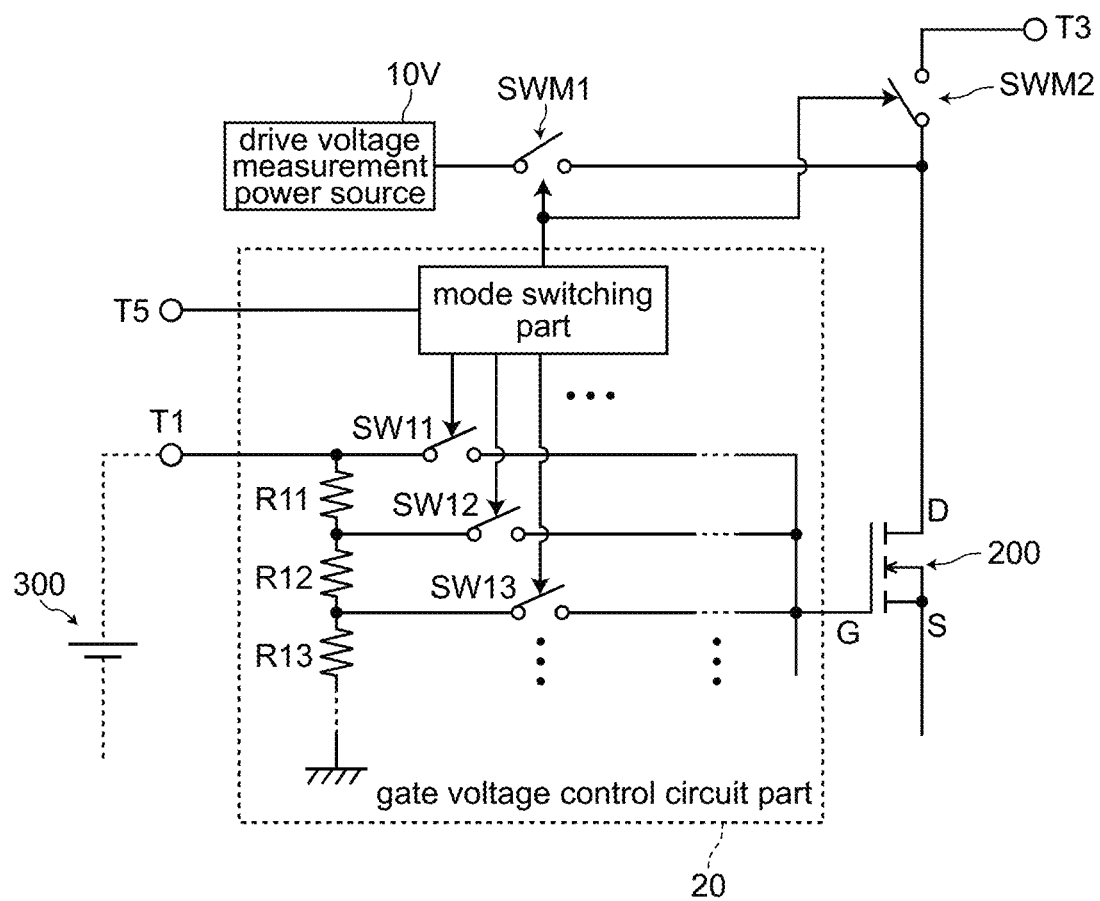
FIG. 7 is an explanatory view of a gate voltage control (circuit) part 20.

FIG. 7 is an explanatory view of the gate voltage control circuit part 20. FIG. 7 shows a concrete example of the gate voltage control circuit part 20. A portion surrounded by a dotted line indicates the gate voltage control circuit part 20. The gate voltage control circuit part 20 includes a mode switching part 201. A plurality of resistors R11, R12, R13, . . . are formed at a plurality of potentials (voltages) between the gate drive power source 300 (power source voltage $V_{DD}$) and a ground. A potential is arbitrarily selected from the plurality of potentials (voltages) in response to a mode, and the selected potential is applied to the gate electrode G as a gate voltage.

When a mode instruction signal Pg which instructs a measurement mode is inputted to the semiconductor module 1 (mode switching part 201), the semiconductor module 1 is brought into a measurement mode. The mode switching part 201 turns on the switching element SWM1 provided between the threshold voltage measurement power source 10V and the switching element 200 which is a threshold value measurement object, and turns off the switching element SWM2 provided between the load 400 and the switching element 200. The mode switching part 201 generates gate voltages shown in FIGS. 4A, 4B, 4C, 4D and 4E by turning on and off the switching elements (switches) SW11, SW12, SW13, . . . , and the generated gate voltage is applied to the gate electrode of the switching element 200.

For example, the switching element SW11 is turned on, and other switching elements SW12, SW13, . . . are turned off. A measurement voltage in such a state is applied to the gate electrode G. The switching element 200 is in an OFF state and hence, a current does not flow between the drain electrode D and the source electrode S (between the first electrode and the second electrode).

Next, the switching element SW12 is turned on, and other witching elements SW11, SW13, . . . are turned off. A voltage higher than the above-mentioned voltage is applied to the gate electrode G. The switching element 200 is brought into an ON state and hence, a current flows between the drain electrode D and the source electrode S (between the first electrode and the second electrode). As a result, the current detection part 500 of the switching control circuit part 100 detects the current and the ON/OFF state determination part 30 determines an ON/OFF state of the switching element 200.

The lowest voltage at which the switching element 200 is turned on is a voltage obtained when the switching element SW12 is turned on and other switching elements SW11, SW13, . . . are turned off. The voltage is stored in the memory part 40 as a threshold voltage.

When a mode instruction signal Pg which instructs a control mode is inputted to the semiconductor module 1 (mode switching part 201), the semiconductor module 1 is brought into a control mode. In the control mode, the switching element 200 is turned on using a voltage slightly exceeds the lowest gate voltage which is measured and stored in a measurement mode and turns on the switching element 200 (the voltage obtained when the switching element SW12 is turned on, and other switching elements SW11, SW13, . . . are turned off). In this example, the division of voltage is performed using resistors R11, R12, R13, . . . . However, in a circuit where a plurality of resistors are connected in series and these resistors are connected with the resistors R11, R12, R13, . . . in parallel, a predetermined voltage can be applied to the gate electrode G by a method in which a voltage is taken out from a portion where the resistors are connected in series.

(5) Rogowski Coil

Figure 8A:
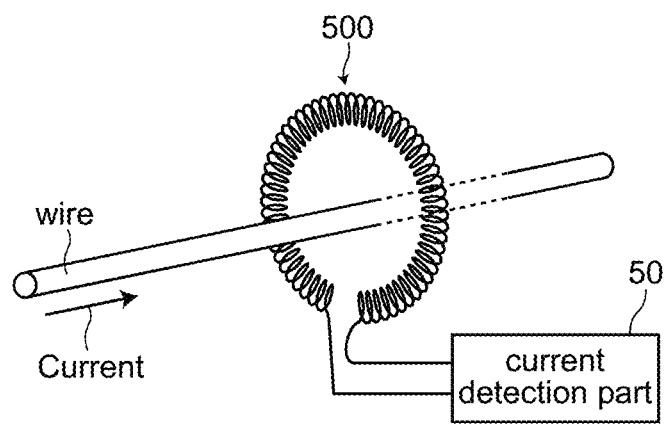
FIG. 8A is an explanatory view of a principle of a Rogowski coil according to the embodiment.

FIG. 8A is an explanatory view of a principle of a current measurement using a Rogowski coil (current detection element) 500 in this embodiment. In a configuration where a coreless coil 500 is disposed around a conductive line wire (conductor) through which a current flows, a voltage corresponding to the current is induced at both ends of the coil. This voltage is a differential waveform of the current and hence, the current waveform can be reproduced by allowing the current to pass through an integrator. Accordingly, the current can be detected by forming the current detection part 50 using the integrator, for example. The measurement of the current can be performed in a state that there is no contact with the conductive line wire.

By forming the ON/OFF determination part 30 using a comparator which compares heights of current waveforms reproduced by the current detection part 50 formed of an integrator, for example, the ON/OFF determination part 30 can perform the ON/OFF determination. The memory part 40 can be formed of a register, a dynamic memory, a static memory or the like which stores gate voltages obtained by turning on or off the switching element 200. The memory part 40 may be formed of a processor in which a processing part and a memory are incorporated.

Figure 8B:
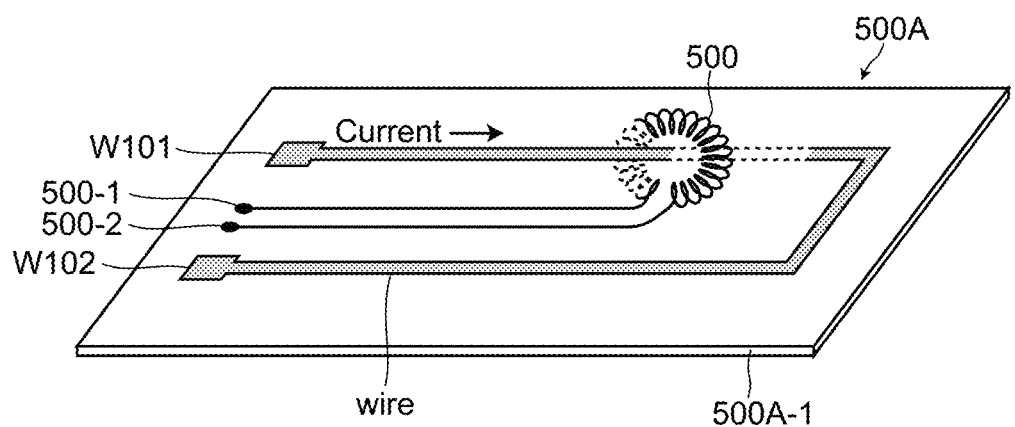
FIG. 8B is an explanatory view of a chip type Rogowski coil according to the embodiment.

FIG. 8B is an explanatory view of a chip-type Rogowski coil 500A used in the embodiment. The chip-type Rogowski coil 500A is formed by embedding a conductive line wire through which a current flows in a chip substrate 500A-1 made of an epoxy resin or the like. A coreless (magnetic coreless) coil 500 is disposed around the conductive line wire. Symbols 500-1 and 500-2 respectively indicate Rogowski coil terminals pulled out from both ends of the Rogowski coil 500. Symbols W101 and W102 are terminals of the conductive line wire.

The Rogowski coil 500 may be formed by winding a pair of coils such that an outgoing coil and incoming coil forms a pair (substantially the same configuration being adopted also in FIGS. 19A and 19B described later).

(6) Semiconductor Substrate

Figure 9A:
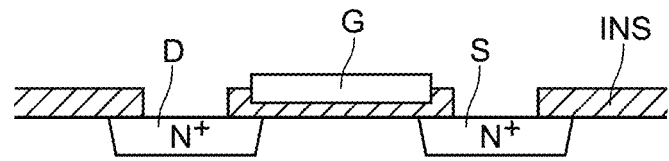
FIGS. 9A, 9B, and 9C are explanatory views of a semiconductor substrate used in the semiconductor module 1 according to the embodiment.
Figure 9B:
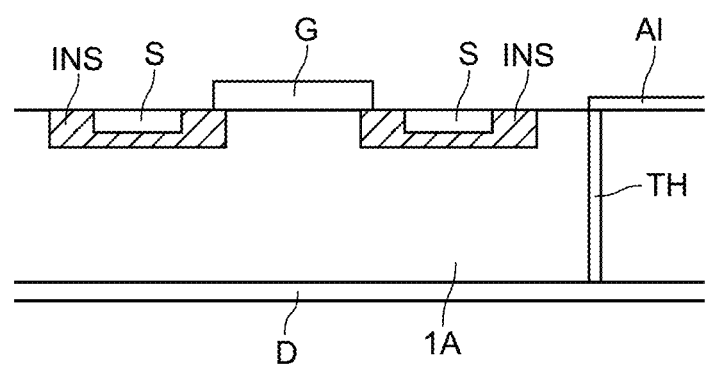
Figure 9C:
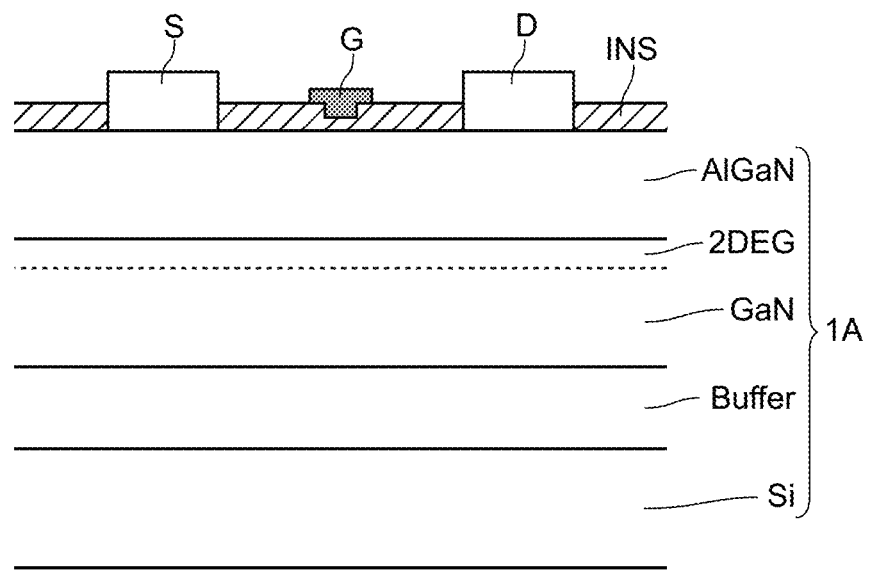

FIGS. 9A, 9B, and 9C show an example of the semiconductor substrate 1A used in the embodiment. All these drawings show cross sections of the semiconductor substrate 1A.

In FIG. 9A, the semiconductor substrate 1A is a semiconductor substrate mainly made of silicon. The semiconductor substrate 1A is a MOSFET, and a circuit is formed on a surface of the semiconductor substrate 1A or in the semiconductor substrate 1A. The drain electrode D, the source electrode S, and the gate electrode G are insulated from each other by insulation layers INS made of silicon dioxide. The semiconductor substrate 1A is a so-called lateral FEF where a circuit formed of the drain electrode D, the source electrode S, the gate electrode G and the like is formed along a surface on one side of the semiconductor substrate 1A.

FIG. 9B shows a so-called vertical FET where the source electrode S and the gate electrode G are formed on one surface side of the semiconductor substrate 1A, and the drain electrode D is formed on the other surface side. However, the drain electrode D on the other surface side is electrically connected to wiring A1 made of aluminum disposed on a side on which the source electrode S and the gate electrode G are disposed via through holes TH. The semiconductor substrate 1A is basically a vertical FET. However, the semiconductor substrate 1A has the structure by which the semiconductor substrate 1A is also referred to as the lateral FET as a whole. The source electrode S is insulated by an insulation layer INS made of silicon dioxide.

FIG. 9C shows an example where a GaN-based semiconductor substrate is used as the semiconductor substrate 1A. A buffer layer Buffer is formed on the silicon substrate Si (an upper side in the drawing), and a gallium nitride layer GaN is formed on the buffer layer. An aluminum gallium nitride layer AlGaN is formed on the gallium nitride layer GaN. The source electrode S, the drain electrode D, and the gate electrode G are formed on the aluminum gallium nitride layer AlGaN. An insulation layer INS is formed between these electrodes. A two dimensional electron gas 2DEG is distributed over the GaN layer. The semiconductor substrate 1A is gallium nitride (GaN)-based semiconductor substrate as a whole.

When the gallium-nitride-based semiconductor substrate is used as the semiconductor substrate 1A, in forming switching elements and the like on the semiconductor substrate 1A by a semiconductor process, it is possible to easily impart a high insulation breakdown strength, a low conductive resistance property, a high-speed switching property and the like to the semiconductor substrate 1A. The semiconductor substrate 1A formed by using the gallium-nitride-based semiconductor substrate is also applicable to a power module for a semiconductor control capable of performing switching at a high current and a high voltage.

(7) Semiconductor Module

The semiconductor module is a module formed by packaging a plurality of semiconductor elements. The semiconductor module is formed by mounting at least one discrete electronic element (for example, a power transistor, a diode, a coil and the like), semiconductor control circuits of these electronic devices and the like on a printed circuit board, and by integrating the plurality of electronic devices. For example, the semiconductor module is a power module where power transistors, semiconductor circuits and the like are integrated. By combining and integrating the discrete electronic devices and the semiconductor circuits, for example, an operation of preparing the plurality of discrete parts and connecting these parts to each other on a user side becomes unnecessary. A burden imposed on circuit designing where a plurality of discrete parts are optimally combined to each other is reduced. In a case where there is a possibility that an adverse effect such as a defect occurs in one of discrete parts arises so that other discrete parts are also damaged, such a semiconductor module exhibits an advantageous effect that a repairing and exchanging operation can be reduced.

FIG. 10 is an explanatory view of the semiconductor module according to the embodiment.

On the semiconductor substrate 1A, a switching chip 200A which forms the switching element 200, the switching element control circuit 100 which controls the switching element 200, and the chip-type Rogowski coil 500A which forms the current detection element 500 are mounted.

The control circuit 100 is directly formed as a circuit on the semiconductor substrate 1A. By forming the semiconductor substrate 1A using a silicon substrate, the control circuit 100 can be formed as a circuit easily.

Symbols T1 to T5 indicate terminals formed on the semiconductor substrate 1A. The terminal T1 is the (+) side input terminal, the terminal T2 is the (−) side input terminal, the terminal T3 is the (+) side output terminal, the terminal T4 is the (−) side output terminal, and the terminal T5 is the control terminal. The respective terminals are formed by mounting wires made of aluminum, copper or the like on the semiconductor substrate 1A, or further applying gold plating, silver plating or the like to the wires.

The discrete switching chip 200A is used as the switching element 200. When a high current flows into the switching element 200 or a high voltage is applied to the switching element 200, to allow the switching element 200 to withstand such a high current or a high voltage, it is desirable to form the switching element 200 separately from the control circuit 100. In this case, the semiconductor module 1 can be easily manufactured, and a yield of the entire semiconductor module 1 can be increased. Further, there may be a case where the drain electrode D and the source electrode S of the switching element 200 are made larger than the drain electrode, the source electrode and the like of the circuit device which forms the control circuit 100 in size. By forming the switching chip 200A using the gallium-nitride-based (GaN-based) semiconductor substrate, it is possible to easily form the device which can withstand a high current or a high voltage. By forming the control circuit 100 using a silicon substrate as the semiconductor substrate 1A and by forming the switching element 200 using the gallium-nitride-based semiconductor, a complicated circuit can be easily formed with high integrity using silicon, and the switching element 200 which can withstand a high current or a high voltage can be easily formed.

As the current detection element, for example, the chip-type Rogowski coil 500A described in FIG. 8B is used.

The control circuit 100 is formed on the semiconductor substrate 1A, and wires made of aluminum, copper or the like which extend from the control circuit 100 are formed on the semiconductor substrate 1A. The control circuit 100 and the switching chip 200A are electrically connected to each other using a bonding wire BW. The control circuit 100 and the chip-type Rogowski coil 500A are also electrically connected to each other by bonding wires BW. The switching chip 200A and the chip-type Rogowski coil 500A are also connected to each other by a bonding wire BW. However, wires on the semiconductor substrate 1A and the switching chip 200A may be bonded to each other by bonding wires, and the wires on the semiconductor substrate 1A and the chip-type Rogowski coil 500A may be bonded to each other by bonding wires so that the switching chip 200A and the chip-type Rogowski coil 500A are electrically connected to each other indirectly.

A flexible substrate or a conductive adhesive agent may be used in place of the bonding wire BW. Bumps made of gold, silver or the like may be formed on terminals of the switching chip 200A and the chip-type Rogowski coil 500A, and the terminals on the semiconductor substrate 1A and the bumps may be heated so that bumps are bonded to the terminals by welding.

3. Modifications

Hereinafter, modifications of the embodiment are described. In the drawings, portions indicated by the same symbol have the same meaning in this specification. The description of the portions which have been described heretofore are omitted.

[Modification 1]

In a semiconductor module 2 shown in FIG. 11, a control circuit 100 is formed on a semiconductor substrate 1A. A switching chip 200A is a gallium-nitride-based semiconductor substrate on which a drain electrode D, a source electrode S (indicated by a dotted line), and a gate electrode G are formed. The switching chip 200A of the gallium-nitride-based semiconductor substrate having a flat plate shape is mounted on the semiconductor substrate 1A having a flat plate shape in an overlapping manner. A chip-type Rogowski coil 500A is mounted on the switching chip 200A in an overlapping manner as viewed in a direction perpendicular to the semiconductor substrate 1A (switching chip 200A) having a flat plate shape. These units are electrically connected to each other by bonding wires BW or the like.

With such a configuration, the control circuit 100 is spaced apart from the switching chip 200A and the chip-type Rogowski coil 500A and hence, even when a high current flows into the switching chip 200A or the chip-type Rogowski coil 500 or a high voltage is applied to the switching chip 200A or the chip-type Rogowski coil 500 so that the switching chip 200A or the chip-type Rogowski coil 500 is turned on or off, it is possible to reduce an effect caused by such turning on or off of the switching chip 200A or the chip-type Rogowski coil 500 to the control circuit 100.

Further, a size of the semiconductor substrate 1A having a flat plat shape in a flat plate direction can be reduced and hence, downsizing of the semiconductor module 1 can be realized.

[Modification 2]

Figure 12:
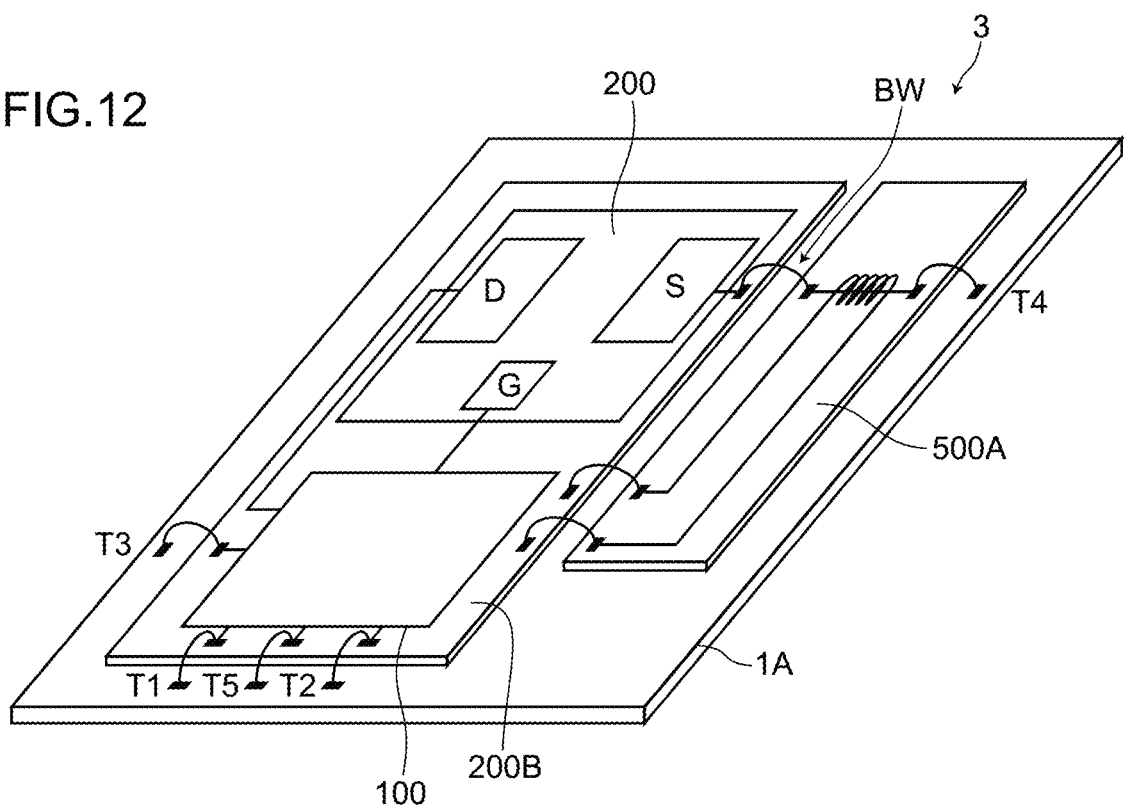
FIG. 12 is an explanatory view of a semiconductor module 3 according to a modification.

In a semiconductor module 3 shown in FIG. 12, a switching chip 200B and a chip-type Rogowski coil 500 are mounted on a semiconductor substrate 1A. On the switching chip 200B, a switching element and a control circuit 100 are mounted. The switching element is formed by mounting a drain electrode D, a source electrode S, and a gate electrode on a silicon-based or gallium-nitride-based semiconductor substrate. The switching chip 200B is directly electrically connected to the chip-type Rogowski coil 500A by bonding wires BW or the like. Alternatively, the switching chip 200B is indirectly electrically connected to the chip-type Rogowski coil 500 by bonding wires BW or the like via wires on the semiconductor substrate 1A.

With such a configuration, the semiconductor module 3 can be easily manufactured by mounting the switching element 200 and the control circuit 100 on the same substrate.

[Modification 3]

Figure 13:
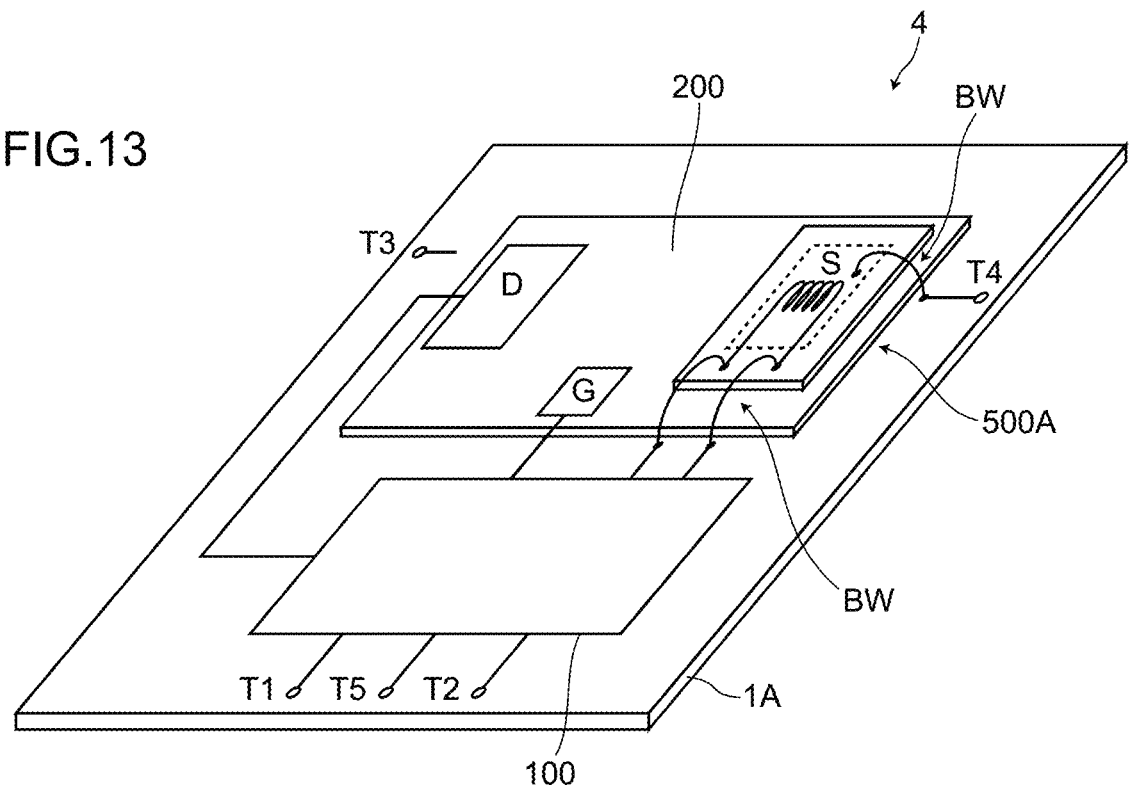
FIG. 13 is an explanatory view of a semiconductor module 4 according to a modification.

In a semiconductor module 4 shown in FIG. 13, a control circuit 100 and a switching element 200 are formed on a semiconductor substrate 1A. A chip-type Rogowski coil 500A is mounted on the semiconductor substrate 1A (switching chip 200A) having a flat plate shape in an overlapping manner as viewed in a direction perpendicular to the semiconductor substrate 1A. These parts are bonded to each other by bonding wires BW or the like.

With such a configuration, the switching element 200 and the control circuit 100 can be easily formed on the same substrate 1A. Further, the control circuit 100 is spaced apart from the switching chip 200A and the chip-type Rogowski coil 500A and hence, it is possible to reduce an effect of a high current which flows into the switching chip 200A or the chip-type Rogowski coil 500A or a high voltage which is applied to the switching chip 200A or the chip-type Rogowski coil 500A to turning on/off of the control circuit 100.

A size of the semiconductor substrate 1A having a flat plate shape in a flat plate direction can be reduced and hence, downsizing of the semiconductor module 1 can be realized.

[Modification 4]

Figure 14:
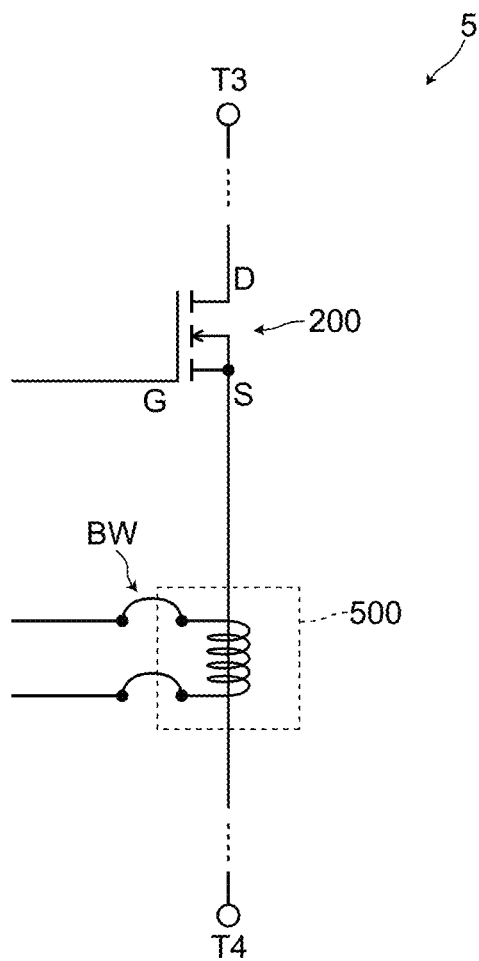
FIG. 14 is a circuit explanatory view of a switching element 200 and surrounding of the switching element 200 of a semiconductor module 5 according to a modification.

FIG. 14 shows a modification of the switching element 200 mounted on a semiconductor module 5 (an explanatory view of the semiconductor module 5 obtained by modifying the switching element 200). The switching element 200 shown in FIG. 14 is a normally-off (OFF in a normal state) switching element 200. For example, the switching element 200 can be formed using a gallium nitride TET. A chip-type Rogowski coil 500 is electrically connected to other circuit elements in the semiconductor module 5 by bonding wires BW or the like. A path between a drain electrode D and a source electrode S of the normally-off TET switching element 200 is OFF in a normal state, and is turned on when an ON signal is inputted to a gate electrode G.

With such a configuration, consumption of electric power can be easily suppressed. Further, the switching element is OFF in a normal state when a high current flows into the switching element or a high voltage is applied to the switching element and hence, a problem that a high current flows into the switching element so that an accident occurs or a load circuit is damaged minimally occurs.

[Modification 5]

Figure 15A:
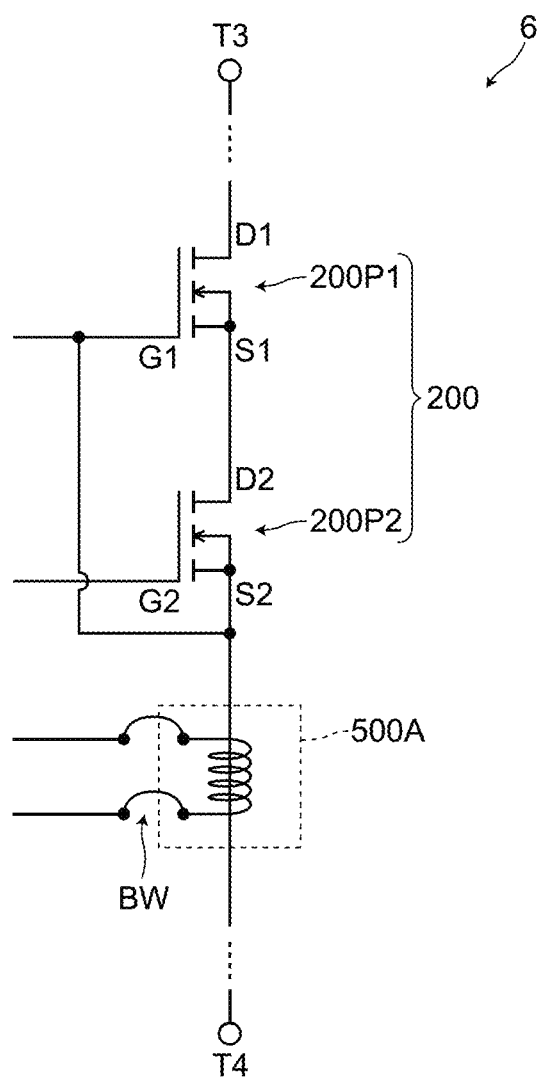
FIGS. 15A and 15B are circuit explanatory views of a switching element 200 and surrounding of the switching element 200 of a semiconductor module 6 according to a modification.
Figure 15B:
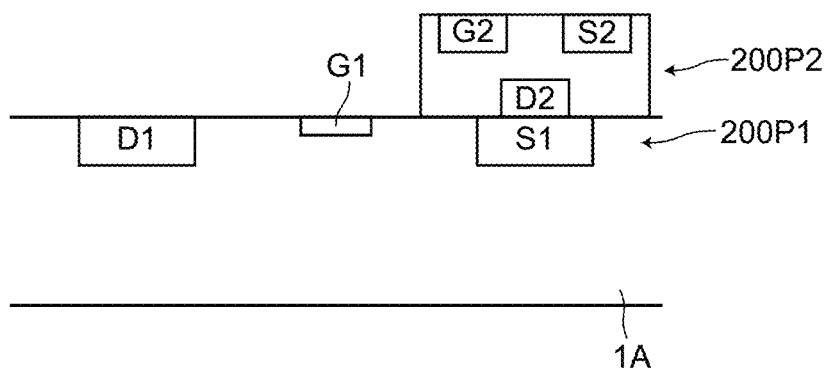

FIGS. 15A and 15B show another modification of the switching element 200 mounted on a semiconductor module 6 (an explanatory view of the semiconductor module 6 obtained by modifying the switching element 200).

With respect to the switching element 200 shown in FIG. 15A, the switching element 200 is formed by combining an FET switching element (semiconductor switch) 200P1 in which a path between a drain electrode D1 and a source electrode S1 is ON in a normal state (normally-on) where a particular voltage is not applied to a gate electrode G1, and an FET switching element (semiconductor switch) 200P2 in which a path between a drain electrode D2 and a source electrode S2 is OFF in a normal state (normally-off) where the particular voltage is not applied to a gate electrode G2. The normally-on switching element 200P1 can be formed using, for example, a gallium-nitride-based semiconductor. The normally-off switching element P2 can be formed using, for example, a low withstand voltage semiconductor such as a silicon-based semiconductor or a gallium-nitride-based semiconductor.

When the gallium-nitride-based semiconductor is used, the normally-on switching element (semiconductor switch) 200P1 can be formed relatively easily. When the low withstand voltage semiconductor is used, both the normally-on switching element and the normally-off switching element can be formed relatively easily.

In the combination of the switching element 200P1 and the switching element 200P2, although the switching element 200P1 is formed of a normally-on switching element, by combining the normally-on switching element 200P1 with the normally-off switching element 200P2, the switching element 200P formed by combining the switching element 200P1 and the switching element 200P2 can be formed as a normally-off switching element. Further, the switching element 200P1 can be controlled by the switching element 200P2 formed using the low withstand voltage semiconductor and hence, it is possible to use the switching element 200P1 as a switching element which allows a high current to flow into the switching element and a high voltage to be applied to the switching element.

FIG. 15B is a constitutional example of a semiconductor when the semiconductor is used for forming a circuit shown in FIG. 15A.

The switching element 200P1 having a drain electrode D1, a source electrode S1, and a gate electrode G1 is formed on a semiconductor substrate 1A formed using a gallium-nitride-based semiconductor. The switching element 200P1 is a gallium-nitride-based semiconductor chip. The switching element 200P1 which is a low withstand voltage silicon-based semiconductor chip (having a drain electrode D2, a source electrode S2, and a gate electrode G2) is mounted on the switching element 200P1. Both switching elements are electrically connected to each other by welding, compression bonding, bump connection using a conductive resin or the like, wire bonding, or connection using a flexible substrate with the switching an element 200P2 in a face-down bonding state.

[Modification 6]

Figure 16:
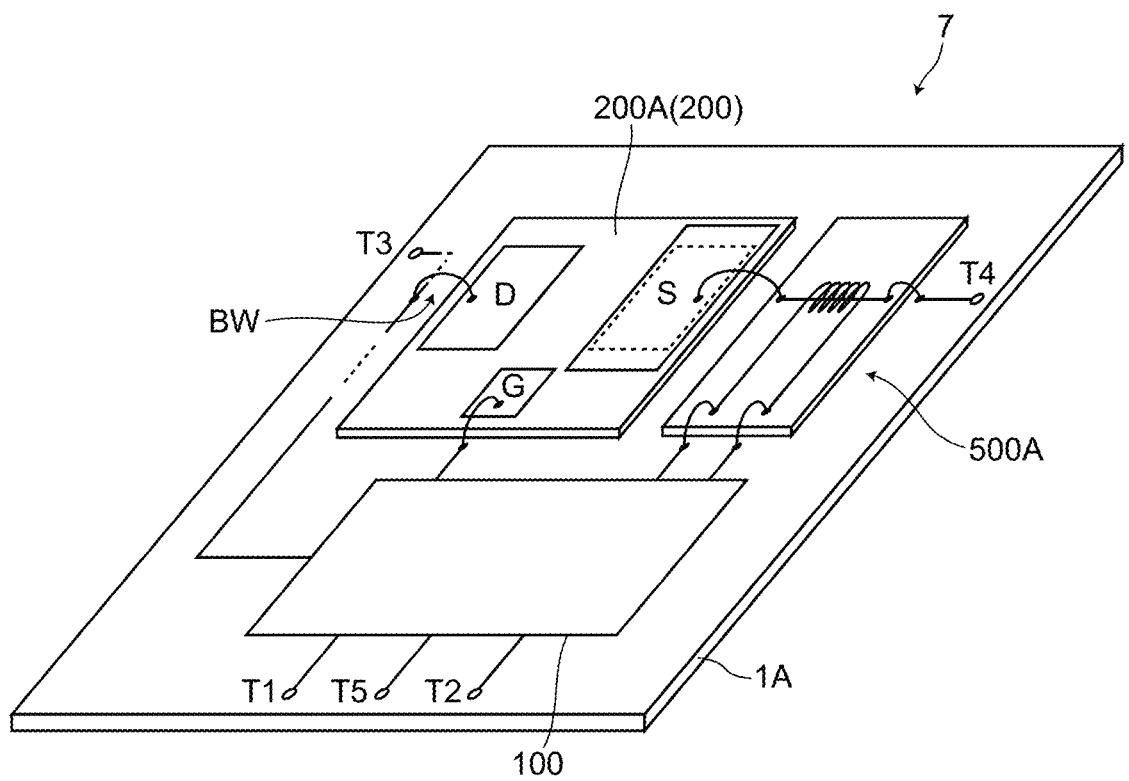
FIG. 16 is a circuit explanatory view of a switching element 200 and surrounding of the switching element 200 of a semiconductor module 7 according to a modification.

FIG. 16 shows a mounting example of a semiconductor module 7 where the normally-on switching element 200P1 and the normally-off low withstand voltage switching element 200P2 shown in FIGS. 15A and 15B are mounted on a semiconductor substrate 1A.

A control circuit 100 is formed on the semiconductor substrate 1A made using a silicon-based semiconductor or the like. With respect to the switching element 200A, a gallium-nitride-based semiconductor substrate (chip) which forms the normally-on switching element 200P1 is used as a base, and a silicon-based substrate (chip) which forms the normally-off low withstand voltage switching element 200P2 is mounted on the normally-on switching element 200P1. The switching element 200P2 is mounted on the switching element 200P2 in an overlapping manner as viewed in a direction perpendicular to a planer extension direction of the semiconductor substrate 1A having a flat plate shape. The switching elements 200P1 and 200P2 are electrically connected to each other by face-down bonding, wire bonding or the like of the switching element 200P2 to the switching element 200P1.

A chip-type Rogowski coil 500A is also mounted on the semiconductor substrate 1A.

The control circuit 100, the semiconductor switches 200 (semiconductor switches 200P1 and 200P2), and the chip-type Rogowski coil 500A which are mounted on the semiconductor substrate 1A are electrically connected to each other by wire bonding WB, face-down bonding, a conductive adhesive agent, a flexible substrate F or the like.

With such a configuration, the switching element 200P1 which has a withstand strength against a high current or a high voltage and the switching element 200P2 having a low withstand voltage which can be manufactured easily can be integrally formed and hence, the semiconductor module 1 can be manufactured easily. It is also possible to make use of the advantageous effects of the modification described with reference to FIGS. 15A and 15B.

[Modification 7]

Figure 17:
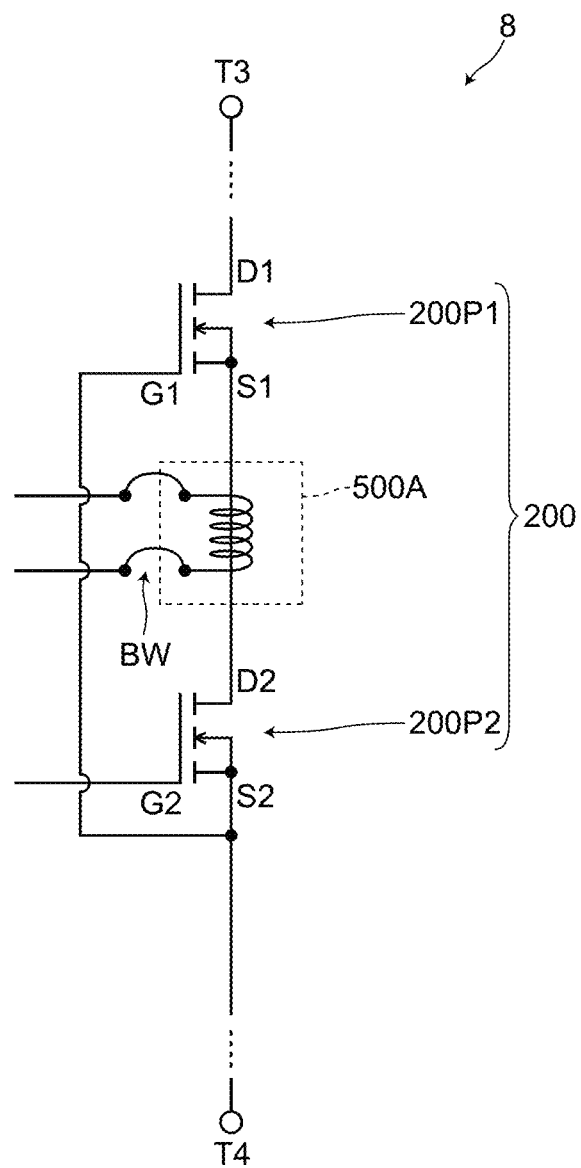
FIG. 17 is an explanatory view of a semiconductor module 8 according to a modification.

FIG. 17 shows a modification of the switching element 200 shown in FIG. 15A (an explanatory view of a semiconductor module 8 obtained by modifying the switching element 200). In FIG. 15A, both of the semiconductor switches 200P1 and 200P2 which form the switching element 200 are connected to one side of the chip-type Rogowski coil 500A. On the other hand, in FIG. 17, the semiconductor switches 200P1 and 200P2 are connected to the chip-type Rogowski coil 500A in a state where semiconductor switches 200P1 and 200P2 sandwich the chip-type Rogowski coil 500A. This is because it is not always necessary to arrange the semiconductor switches 200P1 and 200P2 close to each other.

By adopting the configuration shown in FIG. 17, the flexible arrangement of the semiconductor switches 200P1 and 200P2 can be realized.

When the semiconductor module 1 is formed in accordance with the circuit configuration shown in FIG. 17, the semiconductor module 1 can be formed in the same manner as the semiconductor module 1 shown in FIG. 16.

[Modification 8]

Figure 18:
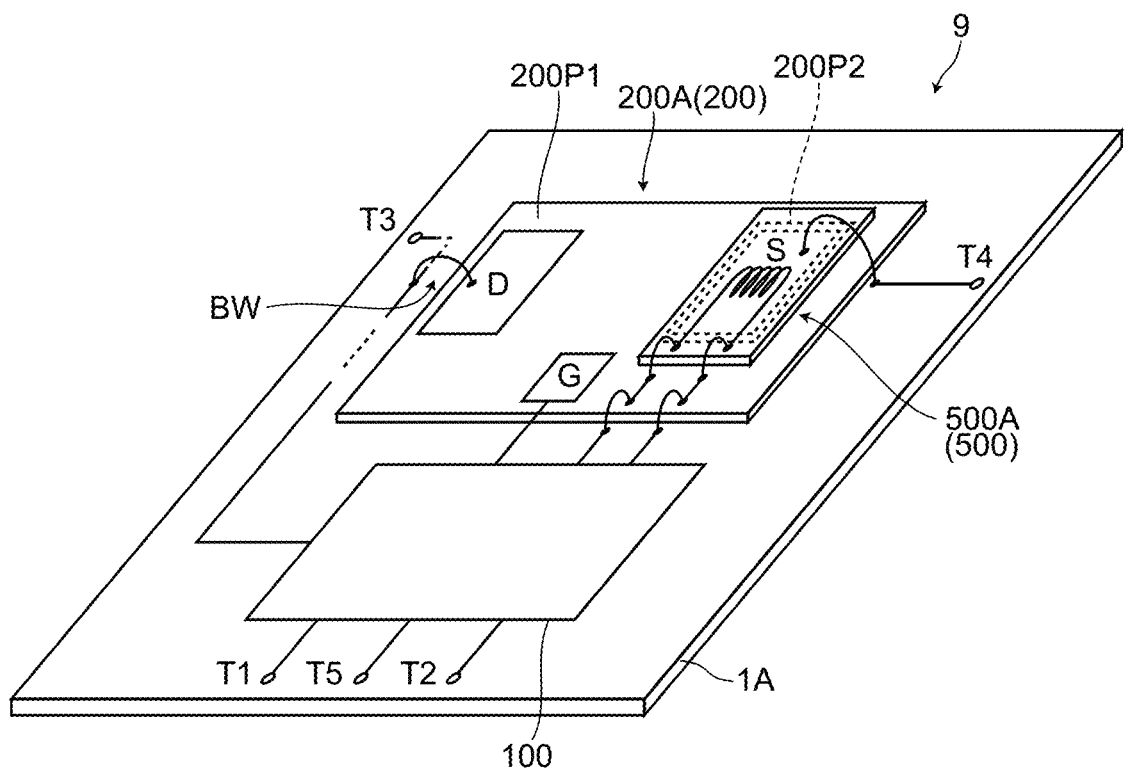
FIG. 18 is an explanatory view of a semiconductor module 9 according to a modification.

In a semiconductor module 9 shown in FIG. 18, a normally-on gallium nitride semiconductor switch (switching element) 200P1 and a normally-off low withstand voltage semiconductor switch (switching element) 200P2 are mounted on a semiconductor substrate 1A having a flat plate shape. The semiconductor switch 200P2 is mounted in a laminated manner on the semiconductor switch 200P1 which is mounted in a laminated manner on a flat plate surface of the semiconductor substrate 1A. A chip-type Rogowski coil 500A is mounted in a laminated manner on the semiconductor switch 200P2.

With such a configuration, the semiconductor switches 200P1 and 200P2, and the chip-type Rogowski coil 500A are formed in a laminated manner spaced apart from a control circuit 100 and hence, even when a current which flows in the switching element (switching chip) 200A is large, it is possible to realize downsizing of the semiconductor module 1 while reducing an effect of the high current to the control circuit 100.

[Modification 9]

Figure 19A:
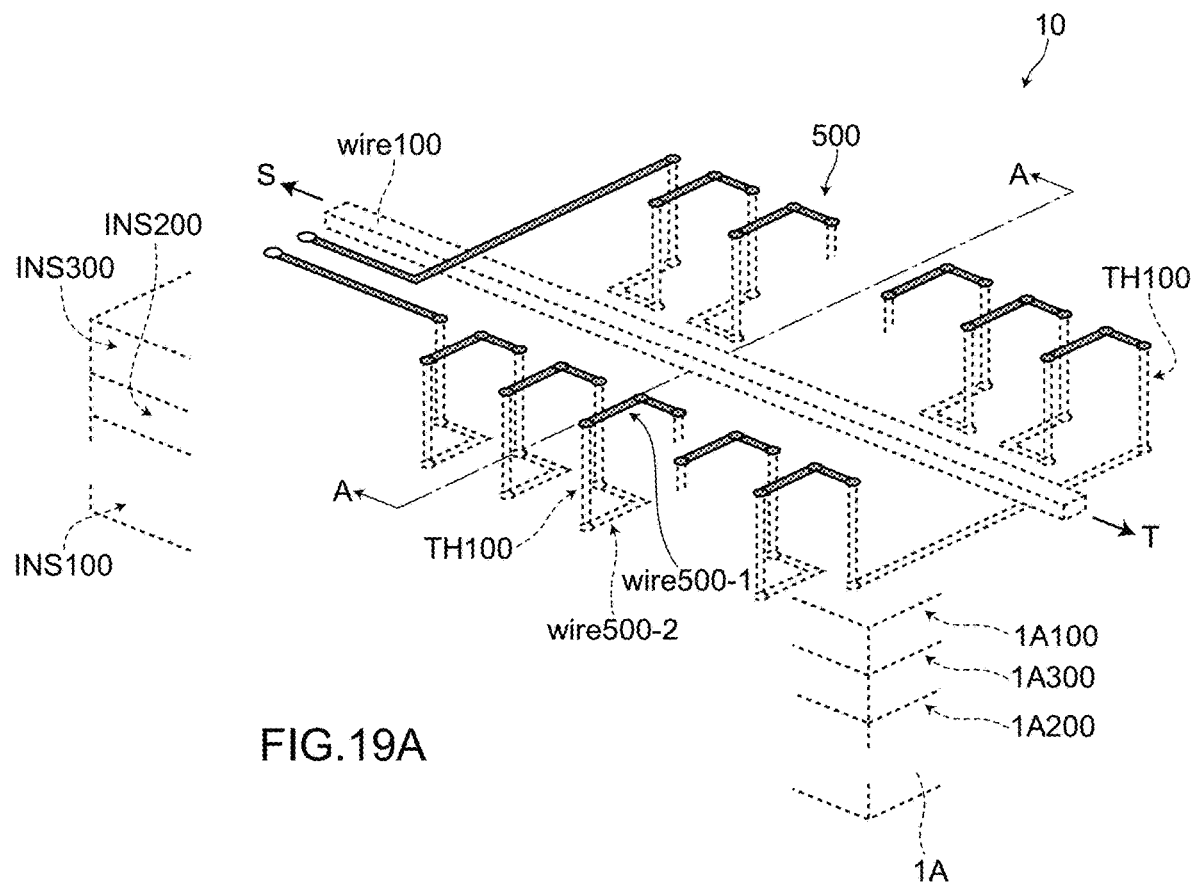
FIGS. 19A and 19B are explanatory views of a Rogowski coil 500 and elements relating to the Rogowski coil 500 of a semiconductor module 10 according to a modification.
Figure 19B:
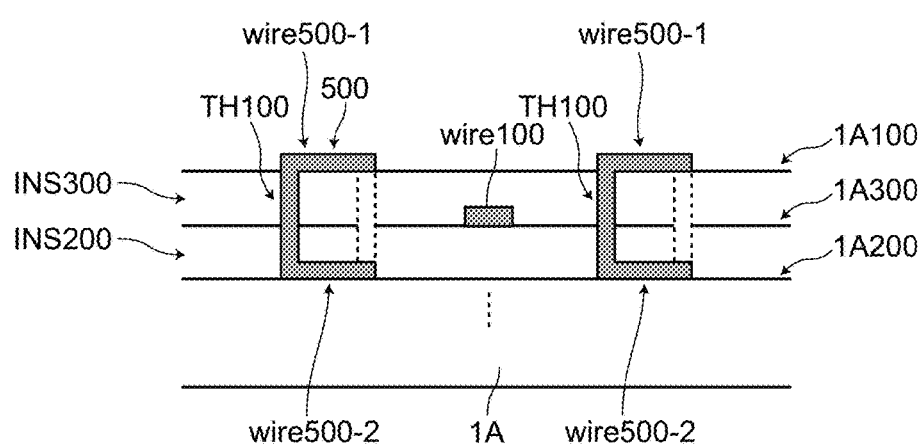

FIGS. 19A and 19B are explanatory views of a semiconductor substrate module 10 according to a modification. A Rogowski coil 500 is incorporated in a semiconductor substrate 1A. FIG. 19A is a see-through perspective view of a portion of the semiconductor substrate 1A in which the Rogowski coil 500 is incorporated. FIG. 19B is a cross sectional view of FIG. 19A (a cross sectional view showing a cross section by vertically cutting a portion indicated by symbol A in the drawing as viewed in a direction of A).

Conductive lines (wires) wire 500-1 made of aluminum, copper or the like are formed on a surface 1A200 of the semiconductor substrate 1A by etching of a conductor, inkjet ejection of a conductive material or the like. The conductive lines 500-1 are covered by an insulation film INS200. A conductive line wire 100 which is a wire made of aluminum, copper or the like is formed on the insulation film INS200 (on a surface 1A300) by etching, inkjet ejection of a conductive material or the like. The conductive line wire 100 is covered by an insulation film INS300. The conductive line wire 100 is a wire through which a current flowing between a drain electrode D and a source electrode S of a switching element 200 flows. Conductive line (wire) wire 500-2 made of aluminum, copper or the like are formed on the insulation film INS300 (on a surface 1A100), by etching of a conductor, inkjet ejection of a conductive material or the like. The conductive lines (wires) wire 500-1 on the surface 1A100 and the conductive lines (wires) wire 500-1 on the surface 1A200 are electrically connected to each other via conductive through holes TH100. The Rogowski coil 500 is formed by connecting the conductive lines (wires) wire 500-1, the conductive lines (wires) wire 500-2, and the conductive through holes TH100 in series. The Rogowski coil 500 is disposed around the conductive line wire 100 in a rotating manner. The Rogowski coil 500 is a circulating wire which is helically formed in a circulating manner around the conductive line wire 100 in a direction which intersects with the conductive line wire 100.

With such a configuration, it is possible to easily form, on the semiconductor substrate 1A, the wire (conductive line wire 100) through which a current flowing between a drain electrode D and a source electrode S of a switching element 200 flows, and the circulating wire (the wire 500 having the wire 500-1, the wire 500-2, and the TH100) which is formed in a circulating manner so as to sandwich the wire (conductive line wire 100) through which a current flows via the wire (conductive line wire 100) and insulation layers (INS200, INS300) using a semiconductor process. By forming the Rogowski coil 500 using the circulating wire, further downsizing of the semiconductor module 1 can be also realized.

A portion of the semiconductor substrate 1a shown in FIGS. 19A and 19B may be formed as a chip-type Rogowski coil 500A which is formed as an element separate from other circuits. The semiconductor module 1 may be formed using this chip-type Rogowski coil 500A.

[Modification 10]

A semiconductor module in the modification 10 is formed such that a semiconductor substrate 1A is not formed of a semiconductor but is formed of an insulating material such as an epoxy resin or a glass epoxy resin unlike the modification 9, and other configurations of the modification are set substantially equal to the corresponding configurations of a modification 9.

Further, a chip-type Rogowski coil 500A may be formed in the same manner as the chip-type Rogowski coil 500A of the modification 9, and the semiconductor module may be formed using this chip-type Rogowski coil 500A.

The description has been made heretofore with respect to the case where the position at which the Rogowski coil which forms a current detection element 500 is disposed is on a second electrode (source electrode) S side. However, the Rogowski coil may be disposed on a first electrode (drain electrode) D side. A specific example of such a configuration is described hereinafter.

[Modification 11]

Figure 20:
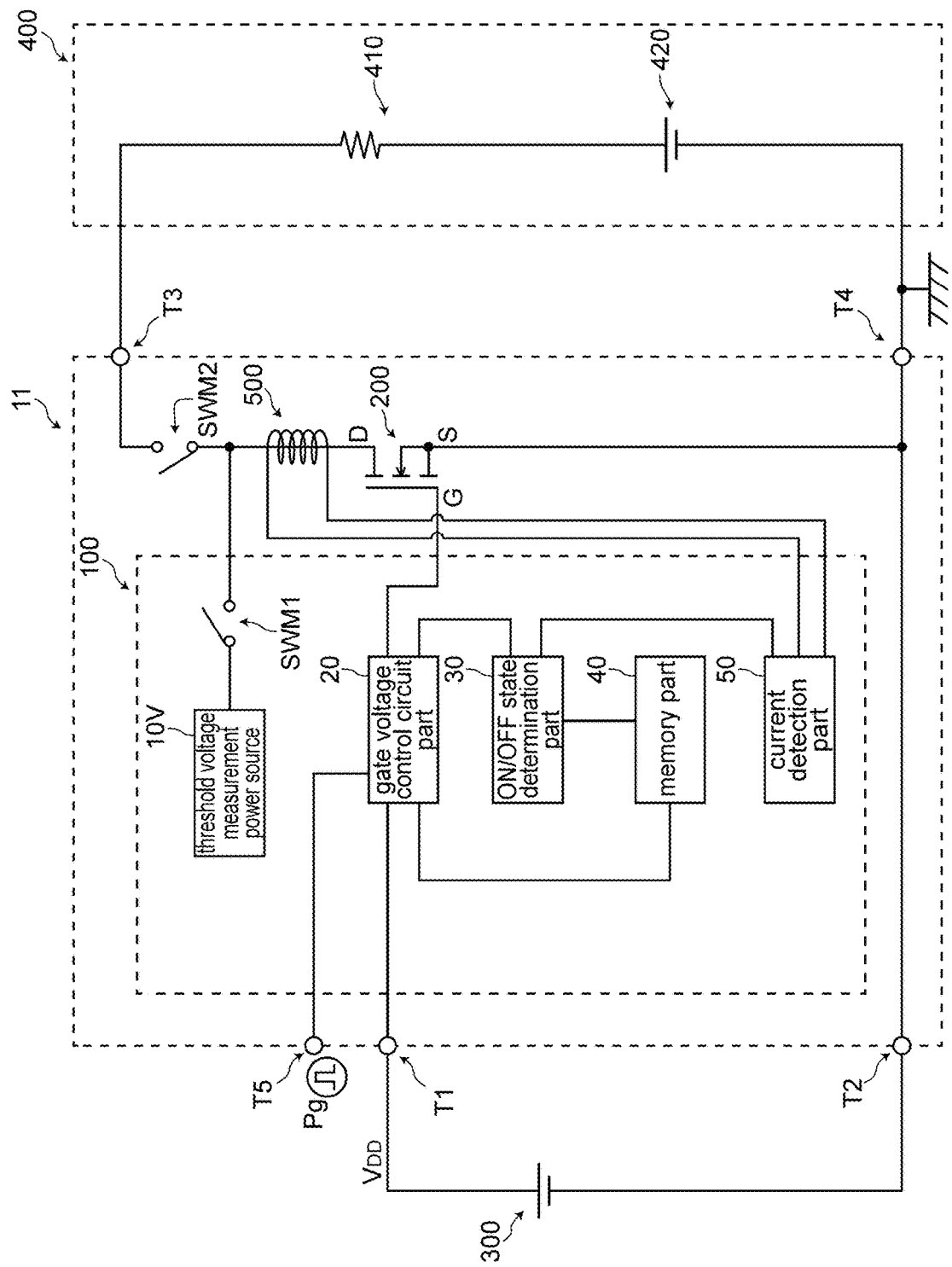
FIG. 20 is a circuit diagram showing a semiconductor module 11 according to a modification.
Figure 21:
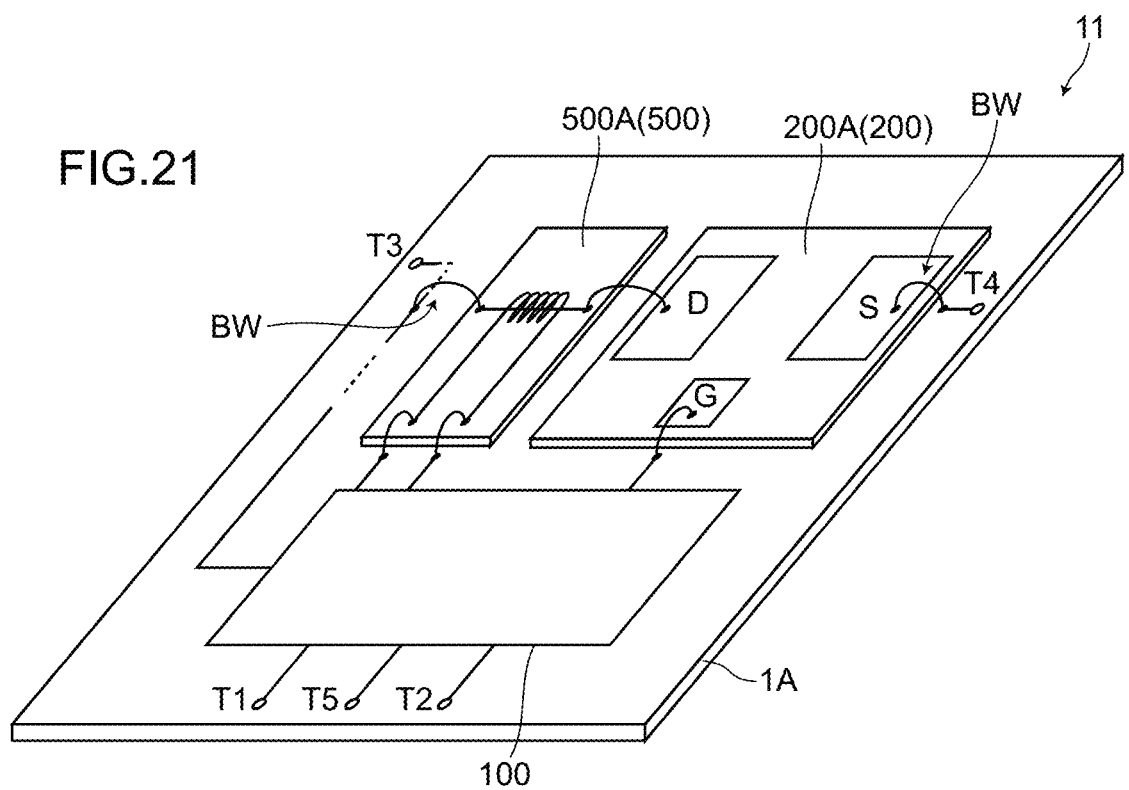
FIG. 21 is an explanatory view of the semiconductor module 11 according to the modification.
Figure 22:
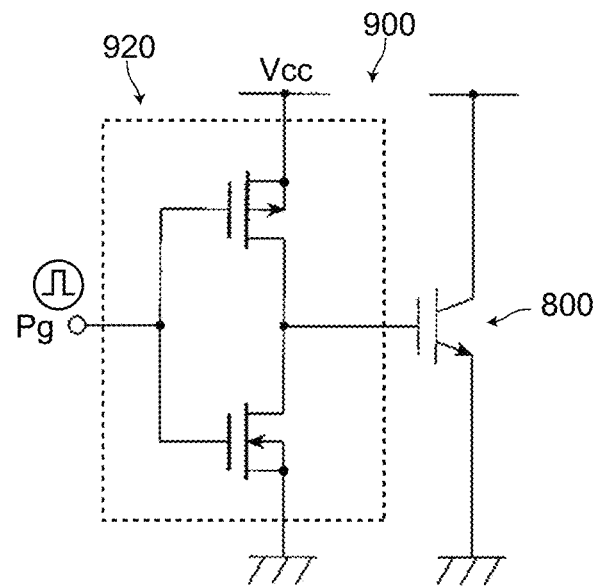
FIG. 22 is an explanatory view of a conventional example.

FIG. 20 and FIG. 21 are explanatory views of a semiconductor substrate module 11 according to the modification. The semiconductor module 11 is a semiconductor module which is obtained by modifying the semiconductor module 1 according to the embodiment. FIG. 20 which is a circuit diagram of the semiconductor substrate module 11 corresponds to FIG. 1 which is the circuit diagram of the semiconductor substrate module 1, and FIG. 21 which is an explanatory view of the semiconductor module 11 corresponds to FIG. 10 which is the explanatory view of the semiconductor substrate module 1.

As shown in FIG. 20 and FIG. 21, in the modification 11, a current detection element (Rogowski coil) 500 is disposed on a first electrode (drain electrode) D side. Concretely, the current detection element 500 detects a switching current which flows through a wire between a first electrode (drain electrode) D and a terminal T3. As shown in FIG. 21, a chip-type Rogowski coil 500A is used as the current detection element, and the current detection element is disposed on a first electrode (drain electrode) D side.

The description of other configurations is substantially equal to the description of the corresponding configurations in the embodiment and hence, the description of other configurations is omitted.

Modifications described hereinafter are described while omitting drawings.

[Modification 12]

In the semiconductor module 2 according to the modification 1 shown in FIG. 11, the chip-type Rogowski coil 500A is disposed in an overlapping manner with the second electrode (source electrode) S. However, in the modification 12, a semiconductor module is provided where the chip-type Rogowski coil 500A is disposed in an overlapping manner with the first electrode (drain electrode) D (drawings being omitted).

[Modification 13]

In the semiconductor module 3 according to the modification 2 shown in FIG. 12, the chip-type Rogowski coil 500A is disposed on a second electrode (source electrode) S side. However, in the modification 13, a semiconductor module is provided where the chip-type Rogowski coil 500A is disposed on a first electrode (drain electrode) D side in the same manner as FIG. 20 and FIG. 21 (drawings being omitted).

[Modification 14]

In the semiconductor module 4 according to the modification 3 shown in FIG. 13, the chip-type Rogowski coil 500A is disposed in an overlapping manner with the second electrode (source electrode) S. However, in the modification 14, a semiconductor module is provided where the chip-type Rogowski coil 500A is disposed in an overlapping manner with the first electrode (drain electrode) D (drawings being omitted).

[Modification 15]

In the semiconductor module 5 according to the modification 4 shown in FIG. 14, the current detection element 500 is disposed so as to detect a switching current which flows between the second electrode (source electrode) S and the terminal T4. However, in the modification 15, a semiconductor module is provided where the current detection element 500 is disposed between a switching element 200 and a terminal T3, and the current detection element 500 detects a switching current which flows between the first electrode (drain electrode) D and the terminal T3 (drawing being omitted).

[Modification 16]

In the semiconductor module 6 according to the modification 5 shown in FIGS. 15A and 15B, the chip-type Rogowski coil 500A is disposed in a wiring portion between the second electrode (source electrode) S2 of the switching element 200P2 and the terminal 14. However, in the modification 16, the chip-type Rogowski coil 500A is disposed on a wiring portion between the first electrode (drain electrode) D1 of the switching element 200P1 and the terminal T3, and the chip-type Rogowski coil 500A detects a switching current which flows between the first electrode (drain electrode) D1 and the terminal T3.

[Modification 17]

In the semiconductor module 7 according to the modification 6 shown in FIG. 16, the chip-type Rogowski coil 500A is disposed on a second electrode (source electrode) S side. However, in the modification 17, a semiconductor module is provided where the chip-type Rogowski coil 500A is disposed on a first electrode (drain electrode) D side in the same manner as FIG. 20 and FIG. 21 (drawings being omitted).

[Modification 18]

In the semiconductor module 9 according to the modification 8 shown in FIG. 18, the chip-type Rogowski coil 500A is disposed in an overlapping manner with the second electrode (source electrode) S. However, in the modification 18, a semiconductor module is provided where the chip-type Rogowski coil 500A is disposed in an overlapping manner with the first electrode (drain electrode) D (drawings being omitted).

The invention claimed is:

1. A semiconductor module, comprising:
a semiconductor substrate;
a switching element which has a first electrode, a second electrode, and a gate electrode, the switching element being configured to turn on/off between the first electrode and the second electrode in response to a predetermined gate voltage applied to the gate electrode;
a control circuit part configured to control the gate voltage; and
a current detection element configured to detect a current which flows between the first electrode and the second electrode of the switching element,
wherein
the switching element, the control circuit part, and the current detection element are on the semiconductor substrate,
the current detection element is formed of a Rogowski coil,
the control circuit part is configured to operate a measurement mode where a gate voltage for turning on/off the switching element is measured,
the control circuit part includes:
a gate voltage control part configured to control the gate voltage such that the gate voltage changes in a stepwise manner in the measurement mode; and
an ON/OFF state determination part configured to determine an ON/OFF state of the switching element based on a detection result of the current which flows between the first electrode and the second electrode by the current detection element in the measurement mode, and
the control circuit part is further configured to
measure a threshold voltage of the switching element by the gate voltage control part and the ON/OFF state determination part, and
control the switching element with the threshold voltage.

2. The semiconductor module according to claim 1, wherein
the control circuit part is configured to be operated by switching a mode between the measurement mode and a control mode where the turning on/off of the switching element is controlled,
the control circuit part further includes:
a threshold voltage measurement power source configured to supply the current to the first electrode of the switching element in the measurement mode; and
a memory part configured to store gate voltage relating information which relates to the threshold voltage in the measurement mode, and
the gate voltage control part is configured to control the gate voltage based on the gate voltage relating information stored in the memory part to bring the switching element is brought into an ON state in the control mode.

3. The semiconductor module according to claim 1, wherein the semiconductor substrate is a gallium-nitride-based semiconductor substrate.

4. The semiconductor module according to claim 3, wherein the switching element comprises:
a normally-on gallium nitride semiconductor switch which is formed using the gallium-nitride-based semiconductor substrate as a material, and
a normally-off semiconductor switch which is connected to the normally-on gallium nitride semiconductor switch in cascade connection and is configured to turn on/off the normally-on gallium nitride semiconductor switch.

5. The semiconductor module according to claim 1, wherein the semiconductor substrate has a flat plate shape, and the switching element and the Rogowski coil are disposed on the semiconductor substrate having the flat plate shape such that the switching element and the Rogowski coil do not overlap with each other as viewed in a direction perpendicular to the semiconductor substrate having the flat plate shape.

6. The semiconductor module according to claim 1, wherein the semiconductor substrate has a flat plate shape, and the switching element and the Rogowski coil are disposed on the semiconductor substrate having the flat plate shape such that the switching element and the Rogowski coil overlap with each other as viewed in a direction perpendicular to the semiconductor substrate having the flat plate shape.

7. The semiconductor module according to claim 1, wherein the semiconductor substrate includes:
- a wire through which the current flows between the first electrode and the second electrode of the switching element; and
- a circulating wire around the wire, wherein the circulating wire is formed of the Rogowski coil.

8. A semiconductor module comprising:
- a semiconductor substrate;
- a switching element which has a first electrode, a second electrode, and a gate electrode, the switching element performing turning on/off between the first electrode and the second electrode in response to applying of a predetermined gate voltage to the gate electrode;
- a control circuit part which controls the gate voltage; and
- a current detection element which detects a current which flows between the first electrode and the second electrode of the switching element, wherein
- the switching element, the control circuit part, and the current detection element are mounted on the semiconductor substrate,
- the current detection element is formed of a Rogowski coil,
- the control circuit part is configured to be operated by switching a mode between a measurement mode where the gate voltage for turning on/off the switching element is measured and a control mode where the turning on/off of the switching element is controlled, the control circuit part includes:
- a threshold voltage measurement power source which supplies the current to the first electrode of the switching element in the measurement mode;
- a gate voltage control part which controls the gate voltage such that the gate voltage changes in a stepwise manner in the measurement mode, and controls the gate voltage so as to control turning on/off of the switching element in the control mode;
- an ON/OFF state determination part which determines an ON/OFF state of the switching element based on a detection result of the current which flows between the first electrode and the second electrode by the current detection element in the measurement mode; and
- a memory part which stores gate voltage relating information which relates to the threshold voltage in the measurement mode, and the gate voltage control part controls the gate voltage based on the gate voltage relating information stored in the memory part when the switching element is brought into an ON state in the control mode.

* * * * *